(12) United States Patent
Friedman et al.

(10) Patent No.: US 11,514,301 B2
(45) Date of Patent: Nov. 29, 2022

(54) MAGNETIC DOMAIN WALL DRIFT FOR AN ARTIFICIAL LEAKY INTEGRATE-AND-FIRE NEURON

(71) Applicant: Board of Regents, The University of Texas System, Austin, TX (US)

(72) Inventors: Joseph S. Friedman, Dallas, TX (US); Wesley H. Brigner, Dallas, TX (US); Naimul Hassan, Dallas, TX (US); Xuan Hu, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 380 days.

(21) Appl. No.: 16/775,876

(22) Filed: Jan. 29, 2020

(65) Prior Publication Data

US 2020/0242462 A1    Jul. 30, 2020

Related U.S. Application Data

(60) Provisional application No. 62/798,222, filed on Jan. 29, 2019.

(51) Int. Cl.
| | |
|---|---|
| *H01L 43/10* | (2006.01) |
| *G06N 3/063* | (2006.01) |
| *G06N 3/04* | (2006.01) |
| *G11C 11/16* | (2006.01) |
| *H01L 43/02* | (2006.01) |
| *H01L 43/08* | (2006.01) |
| *H01L 27/22* | (2006.01) |

(52) U.S. Cl.
CPC ............. *G06N 3/0635* (2013.01); *G06N 3/04* (2013.01); *G11C 11/161* (2013.01); *H01L 27/226* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

2017/0330070 A1    11/2017  Sengupta et al.
2018/0358105 A1*   12/2018  Sasaki ................... G11C 19/14
(Continued)

OTHER PUBLICATIONS

Sengupta et al., "Proposal for an All-Spin Artificial Neural Network: Emulating Neural and Synaptic Functionalities Through Domain Wall Motion in Ferromagnets," IEEE Transactions on Biomedical Circuits and Systems, vol. 10, No. 6, Dec. 2016, 9 pages.

*Primary Examiner* — Benjamin P Sandvik
(74) *Attorney, Agent, or Firm* — Yee & Associates, P.C.

(57) ABSTRACT

The present disclosure provides a domain wall magnetic tunnel junction device. Integration of input spikes pushes a domain wall within a ferromagnetic track toward a magnetic tunnel junction (MTJ). An energy gradient within the track pushes the domain wall away from the MTJ by leaking accumulated energy from the input spikes. If the integrated input spikes exceed the energy leak of the gradient within a specified time period, the domain wall reaches the MTJ and reverses its resistance, producing an output spike. The leaking energy gradient can be created by a magnetic field, a trapezoidal shape of the ferromagnetic track, or nonuniform material properties in the ferromagnetic track.

37 Claims, 23 Drawing Sheets

(56) References Cited

U.S. PATENT DOCUMENTS

| | | | |
|---|---|---|---|
| 2019/0035446 A1* | 1/2019 | Shibata | G11C 11/1673 |
| 2019/0251427 A1* | 8/2019 | Park | G06N 3/06 |
| 2021/0119114 A1* | 4/2021 | Fukami | H01L 43/06 |
| 2021/0383853 A1* | 12/2021 | Shibata | H01L 27/222 |

* cited by examiner

MAGNETIC DOMAIN WALL DRIFT FOR AN ARTIFICIAL LEAKY INTEGRATE-AND-FIRE NEURON

RELATED APPLICATIONS

This application claims priority to U.S. Provisional Application 62/798,222, filed Jan. 29, 2019, the entirety of which is hereby incorporated by reference.

BACKGROUND INFORMATION

Field

The present disclosure relates generally to neural networks, and more specifically to artificial leaky integrate-and-fire neurons implemented in hardware.

Background

Whereas conventional computing machines efficiently solve staggeringly difficult deterministic problems, the human brain is far superior for processing unstructured real world information. Furthermore, the accomplishment of some tasks, such as those related to pattern recognition, can be achieved by the human brain with orders-of-magnitude less energy than with a computer. Though human understanding of our own mental processes is far from complete, neuroscience researchers have identified neurons and synapses as core elements of our neural information processing systems: the neurons emit electrical signals based on input electrical signals, while the synapses provide electrical connectivity between the neurons. These electrical interactions are generally responses to external stimuli and result in changes to the physical state of a person through modifications of memory, hormonal changes, and physical actions (e.g., talking, walking). It is generally believed that these external stimuli cause short- and long-term changes to the synapses, temporarily or permanently modifying the connectivity between neurons. By modifying the connectivity between neurons, the brain responds to external stimuli by altering the circuit through which external stimuli cause changes in the human's physical state. Simultaneously, the brain also responds to these external stimuli by taking the actions prescribed by the circuit.

In order to realize an efficient artificial neuromorphic information processing system, the system should be designed specifically to emulate the electrical interactions present within a biological system. While much previous work has involved software simulation of neurons and synapses with general purpose computing hardware, the energy consumed by these systems exceeds that of the brain by orders of magnitude. Efforts are therefore underway to develop a neuromorphic hardware system, with exciting recent results achieved with silicon transistor circuits that emulate the behavior of both neurons and synapses. However, as silicon transistors inherently provide volatile binary switching that does not readily map to neuron and synapse behavior, it is expected that the use of nanodevices that emulate neuron and synapse behavior will drastically increase the efficiency of neuromorphic computing systems. The non-volatility provided by spintronic devices, as well as memristors, is particularly promising for the development of nanodevices that intrinsically emulate neurological behavior.

While numerous two-terminal nanodevices—particularly memristors—have been shown to modulate the resistance in a non-volatile manner analogous to the behavior of biological synapses, the relative complexity of neuron functionality has impeded the identification of analogous behavior in nanodevices. In particular, neuroscientific studies suggest that biological neurons integrate input signals over time and fire once a threshold value has been reached. In the absence of a strong input, the neurons leak over time and eventually reset to a relaxed state. Furthermore, neighboring neurons interact in an inhibitory manner via a variety of species of connected inhibitory interneurons. These interneurons utilize neurotransmitter projections (i.e., $\gamma$-aminobutyric acid (GABA)) to continuously reduce the effectiveness of neighbors by altering the synaptic efficiency of contributing synapses or directly preventing depolarization.

SUMMARY

An embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. A magnetic field in communication with the ferromagnetic tracks produces an energy gradient that causes the domain wall to leak accumulated energy from integrated input spikes.

Another embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region, and wherein each ferromagnetic track is trapezoidal having a first width at the first end and a second width at the second opposite end, wherein the second width is longer than the first width. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. The trapezoidal shape of the ferromagnetic track produces a domain wall gradient that leaks accumulated energy from integrated input spikes.

Another embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region, and wherein each ferromagnetic track has nonuniform material properties. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. The nonuniform material properties of the ferromagnetic tracks produces a domain wall gradient that leaks accumulated energy from integrated input spikes.

Another embodiment of the present disclosure provides a method of controlling domain wall drift in a domain wall magnetic tunnel junction device comprising applying input current to the device, wherein the device comprises: a ferromagnetic track, wherein the ferromagnetic track has a first fixed magnetization region at a first end and a second fixed magnetization region at a second end, and wherein the second fixed magnetization region has a magnetic direction opposite to the first fixed magnetization region; and a magnetic tunnel junction between the first and second ends of the ferromagnetic track, wherein the magnetic tunnel junction comprises a tunnel barrier on the ferromagnetic track and a fixed ferromagnet on top of the tunnel barrier. Integrating the input current pushes a domain wall within the ferromagnetic track toward the second end, wherein magnetization within the ferromagnetic track is in opposite directions on opposite sides of the domain wall. A constant opposing force pushes the domain wall toward the first end of the ferromagnetic track. If integrating the input current exceeds the constant opposing force within a specified time period, the domain wall reaches a threshold causing the magnetic tunnel junction to change from an anti-parallel state to a parallel state, which produces an output firing spike from the device.

Another embodiment of the present disclosure provides a domain wall magnetic tunnel junction device. The device comprises a ferromagnetic domain wall track having a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends. A magnetic tunnel junction is located between the first and second ends of the domain wall track, wherein the magnetic tunnel junction comprises a fixed ferromagnet, a tunnel barrier beneath the fixed ferromagnet, a free ferromagnet beneath the tunnel barrier, and an electrically insulated, magnetically coupled layer between the free ferromagnet and the ferromagnetic track, wherein the fixed ferromagnet is electrically isolate from the ferromagnetic track. An electric output terminal is coupled to the free ferromagnet.

Another embodiment of the present disclosure provides a neural network. The neural network comprises a first crossbar array of domain wall magnetic tunnel junction synapses and a first plurality of domain wall magnetic tunnel junction artificial neurons configured to receive first input signals from the first crossbar array of domain wall magnetic tunnel junction synapses. The neural network also comprises a second crossbar array of domain wall magnetic tunnel junction synapses configured to receive second input signals from the first plurality of domain wall magnetic tunnel junction artificial neurons. The second input signals comprise output signals from respective free ferromagnets in the first plurality of domain wall magnetic tunnel junction artificial neurons, wherein the free ferromagnets are electrically isolated from input terminals in the domain wall magnetic tunnel junction artificial neurons. A second plurality of domain wall magnetic tunnel junction artificial neurons is configured to receive third input signals from the second crossbar array of domain wall magnetic tunnel junction synapses.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 6B depicts the relationship between DW velocity and current density;

DETAILED DESCRIPTION

Figure 1:
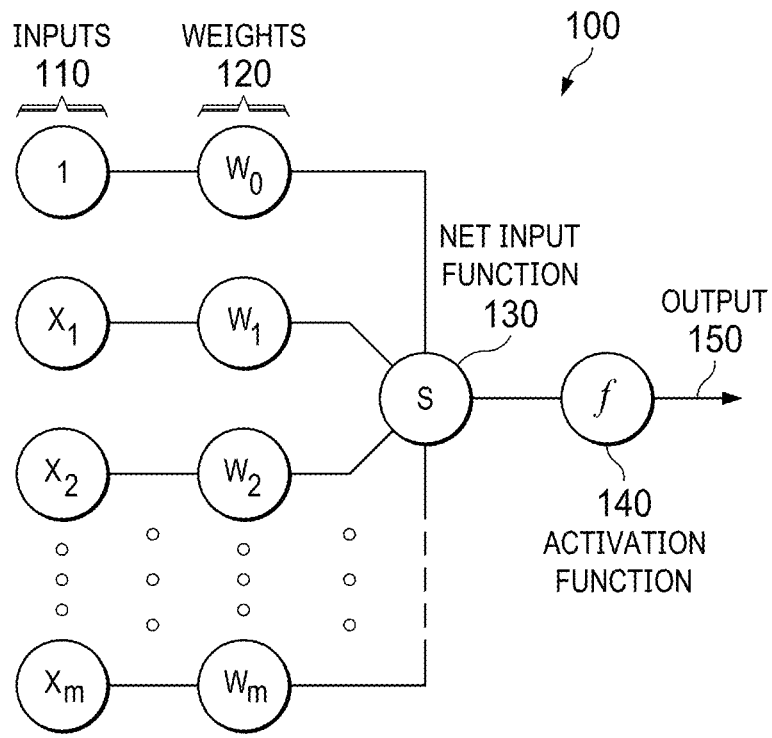
FIG. 1 is a diagram that illustrates a node in a neural network in which illustrative embodiments can be implemented.

The present disclosure recognizes and takes into account that as the nature of firing requires the interaction of external devices and therefore must be implemented in concert with an external circuit, the ideal artificial neuron should inherently perform leaking, integration, and lateral inhibition. Several spintronic neurons have been proposed, including spiking neurons that inherently perform integration. However, these neurons require complementary hardware to perform leaking and lateral inhibition. Furthermore, lateral inhibition has been demonstrated in spintronic neurons through the use of an additional crossbar row.

The present disclosure provides the first artificial neuron that inherently performs integrating, leaking, and lateral inhibition within a single nanodevice. This is achieved by adapting the experimentally-proven domain wall-magnetic tunnel junction (DW-MTJ) device, which has heretofore been applied to Boolean logic, artificial synapses, and artificial neurons that intrinsically provide neither leaking nor lateral inhibition. By adding a hard ferromagnet below the DWMTJ track to cause behavior analogous to leaking, a novel device is here demonstrated with micromagnetic simulation to intrinsically perform the leaking, integration, and lateral inhibition required by an artificial neuron. Similar to previous work, firing is achieved in concert with an external circuit when the MTJ resistance is switched by the propagation of a domain wall within the soft ferromagnetic track. The ferromagnetic tracks create stray fields that inhibit the motion of domain walls within the ferromagnetic tracks of adjacent neurons, thus inherently providing lateral inhibition. The efficacy of this approach within a large system is demonstrated with micromagnetic simulations of a winner-take-all (WTA) output neuron layer that achieves an accuracy of 94% for the well-known task of handwritten digit recognition.

The present disclosure also provides an alternative three-terminal magnetic tunnel junctions (3T-MTJ) neuron in which the fabrication is simplified by reducing the number of material layers: the leaking effect provided by the bottom ferromagnet is here provided instead by shape-based magnetic domain wall (DW) drift.

The present disclosure also provides an alternative 3T-MTJ neuron that simplifies fabrication by reducing the number of material layers. Instead of using an externally applied magnetic field, the leaking functionality is implemented using a magneto-crystalline anisotropy gradient.

Modern von Neumann computing systems are capable of efficiently solving staggeringly difficult problems when provided with a structured data set. However, the human brain outperforms computers when processing unstructured real-world information. In fact, the brain is capable of performing these tasks with many orders of magnitude less energy than is required by computers. This impressive computational efficiency is, according to neuroscientists, the result of complex interactions occurring between neurons and synapses.

Neurons are complex nerve cells which integrate electrical signals received via the cells' dendrites, originate electrical signals (spikes) in the soma (cell body), and propagate these signals forward into their axons to convey information. Meanwhile, synapses are the electrically conductive junctions between the axon of one neuron and the dendrite of another and permit communication between neurons.

FIG. 1 is a diagram that illustrates a node in a neural network in which illustrative embodiments can be implemented. Node 100 combines multiple inputs 110 from other nodes. Each input 110 is multiplied by a respective weight 120 that either amplifies or dampens that input, thereby assigning significance to each input for the task the algorithm is trying to learn. The weighted inputs are collected by a net input function 130 and then passed through an activation function 140 to determine the output 150. The connections between nodes are called edges. The respective weights of nodes and edges might change as learning proceeds, increasing or decreasing the weight of the respective signals at an edge. A node might only send a signal if the aggregate input signal exceeds a predefined threshold. Pairing adjustable weights with input features is how significance is assigned to those features with regard to how the network classifies and clusters input data.

Neural networks are often aggregated into layers, with different layers performing different kinds of transformations on their respective inputs. A node layer is a row of nodes that turn on or off as input is fed through the network. Signals travel from the first (input) layer to the last (output) layer, passing through any layers in between. Each layer's output acts as the next layer's input.

Figure 2:
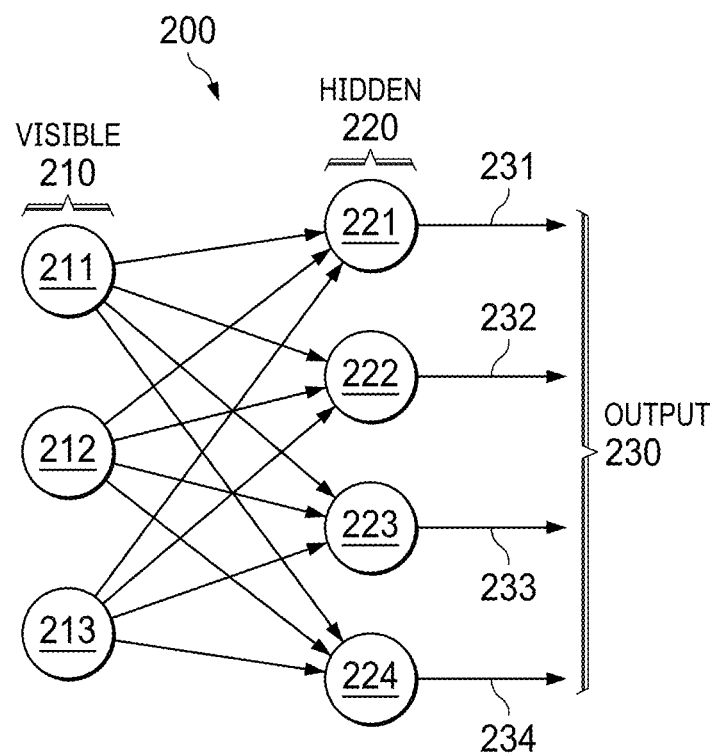
FIG. 2 is a diagram illustrating a neural network in which illustrative embodiments can be implemented.

FIG. 2 is a diagram illustrating a neural network in which illustrative embodiments can be implemented. As shown in FIG. 2, the nodes in the neural network 200 are divided into a layer of visible nodes 210 and a layer of hidden nodes 220. The visible nodes 210 are those that receive information from the environment (i.e. a set of external training data). Each visible node in layer 210 takes a low-level feature from an item in the dataset and passes it to the hidden nodes in the next layer 220. When a node in the hidden layer 220 receives an input value x from a visible node in layer 210 it multiplies x by the weight assigned to that connection (edge) and adds it to a bias b. The result of these two operations is then fed into an activation function which produces the node's output.

In symmetric networks, each node in one layer is connected to every node in the next layer. For example, when node 221 receives input from all of the visible nodes 211-213 each x value from the separate nodes is multiplied by its respective weight, and all of the products are summed. The summed products are then added to the hidden layer bias, and the result is passed through the activation function to produce output 231. A similar process is repeated at hidden nodes 222-224 to produce respective outputs 232-234. In the case of a deeper neural network, the outputs 230 of hidden layer 220 serve as inputs to the next hidden layer.

Neural networks can be stacked to create deep networks. After training one neural net, the activities of its hidden nodes can be used as training data for a higher level, thereby allowing stacking of neural networks. Such stacking makes it possible to efficiently train several layers of hidden nodes. Examples of stacked networks include deep belief networks (DBN), deep Boltzmann machines (DBM), convolutional neural networks (CNN), recurrent neural networks (RNN), and spiking neural networks (SNN).

A primary objective in emulating neurobiological behavior within an artificial system is to efficiently replicate the neuron and synapse functionalities. This can be emulated with software running on standard computer hardware, though such approaches consume significantly greater energy than their biological counterparts. Energy improvements have therefore been demonstrated with dedicated hardware neural networks in which synapse and neuron functionalities are replicated with silicon transistors. However, the history-dependent nature of much synapse and neuron behavior inspire the use of non-volatile devices for increased efficiency.

To that end, non-volatile devices such as memristors and three-terminal magnetic tunnel junctions (3T-MTJs) have been used that thoroughly mimic the functionalities of biological synapses. However, replicating the complex integrative and temporal behaviors occurring within a neuron's cell body (soma) has been a greater challenge.

The development of a type of artificial neuron known as the "leaky integrate-and-fire" (LIF) neuron has been hindered by the need to implement the following functionalities:

1) Integration: Accumulation of a series of input spikes,
2) Leaking: Leaking of the accumulated signal over time when no input is provided, and
3) Firing: Emission of an output spike when the accumulated signal reaches a certain level after a series of integration and leaking.

The development of a hardware neural network requires artificial neurons and synapses that intrinsically function in a manner analogous to their biological analogs. In order to enable fabrication that is compatible with conventional processes, a synapse crossbar array connects the neurons. In order to emulate biological processes and implement the winner-take-all schemes involved in many machine learning techniques, these neurons must provide lateral inhibition, which is achieved here by adapting the DW-MTJ device.

The leaky integrate-and-fire (LIF) neuron has been well established as a primary area of interest for the development of an artificial neuron and is a modified version of the original integrate-and-fire circuit. It is based on the biological neuron, which operates in a network of other neurons, communicating via electrical spikes and chemical signals. In order to emulate this method of communication, an electrical LIF neuron sends spikes of voltage periodically, resulting from input currents arriving through synapses connected to other neurons in the network. In addition, there is also a refractory period, in which a neuron cannot fire for a certain amount of time after it has recently fired.

Figure 3:
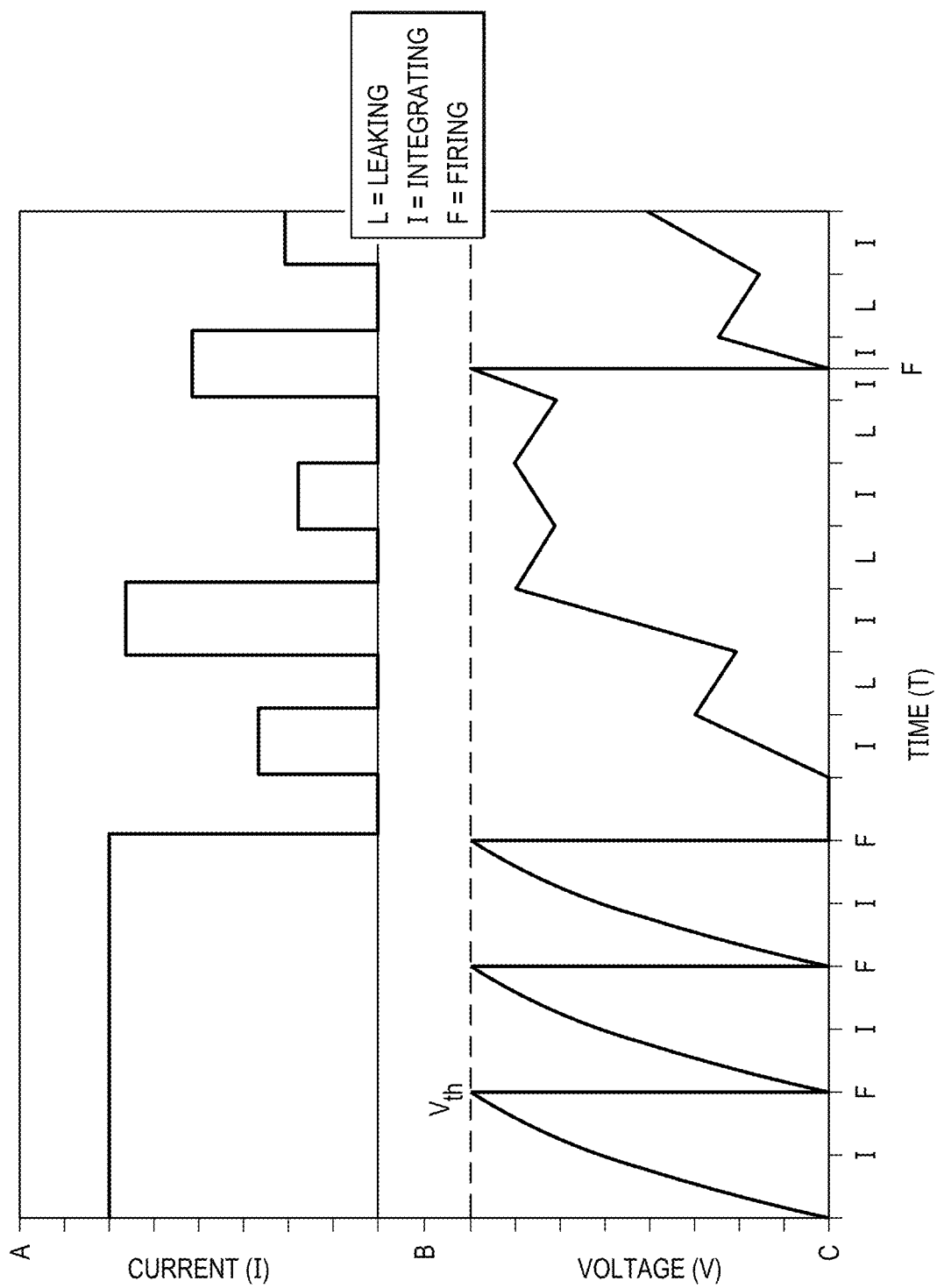
FIG. 3 illustrates the behavior of a LIF neuron in accordance with illustrative embodiments.

FIG. 3 illustrates the behavior of a LIF neuron in accordance with illustrative embodiments. An LIF neuron continually integrates the energy provided by an input current until a threshold is reached and the neuron fires, emitting this energy as a voltage spike that provides current to other neurons via synapse connections. By emitting this energy, the neuron is returned to a low energy state and continues to integrate input current until its next firing. Throughout this process, the energy stored in the neuron continually leaks such that if insufficient input current is provided, the neuron gradually reverts to a low energy state. This prevents the device from indefinitely retaining energy, which would not match the behavior of biological neurons.

The LIF behavior is illustrated in FIG. 3, where an input current continually modulates the energy (stored as voltage) within a LIF neuron. A large current is continually applied during the initial stage, resulting in repeated periods of integration interrupted by firing events. When no current is applied, the neuron leaks energy by decreasing the stored voltage. The input current shown in FIG. 3(a) causes leaking, integrating, and firing, as noted in FIG. 3(b). FIG. 3(c) shows the labels of the three phases that the leaky integrate-and-fire can go through when excited by the input current.

Figure 4:
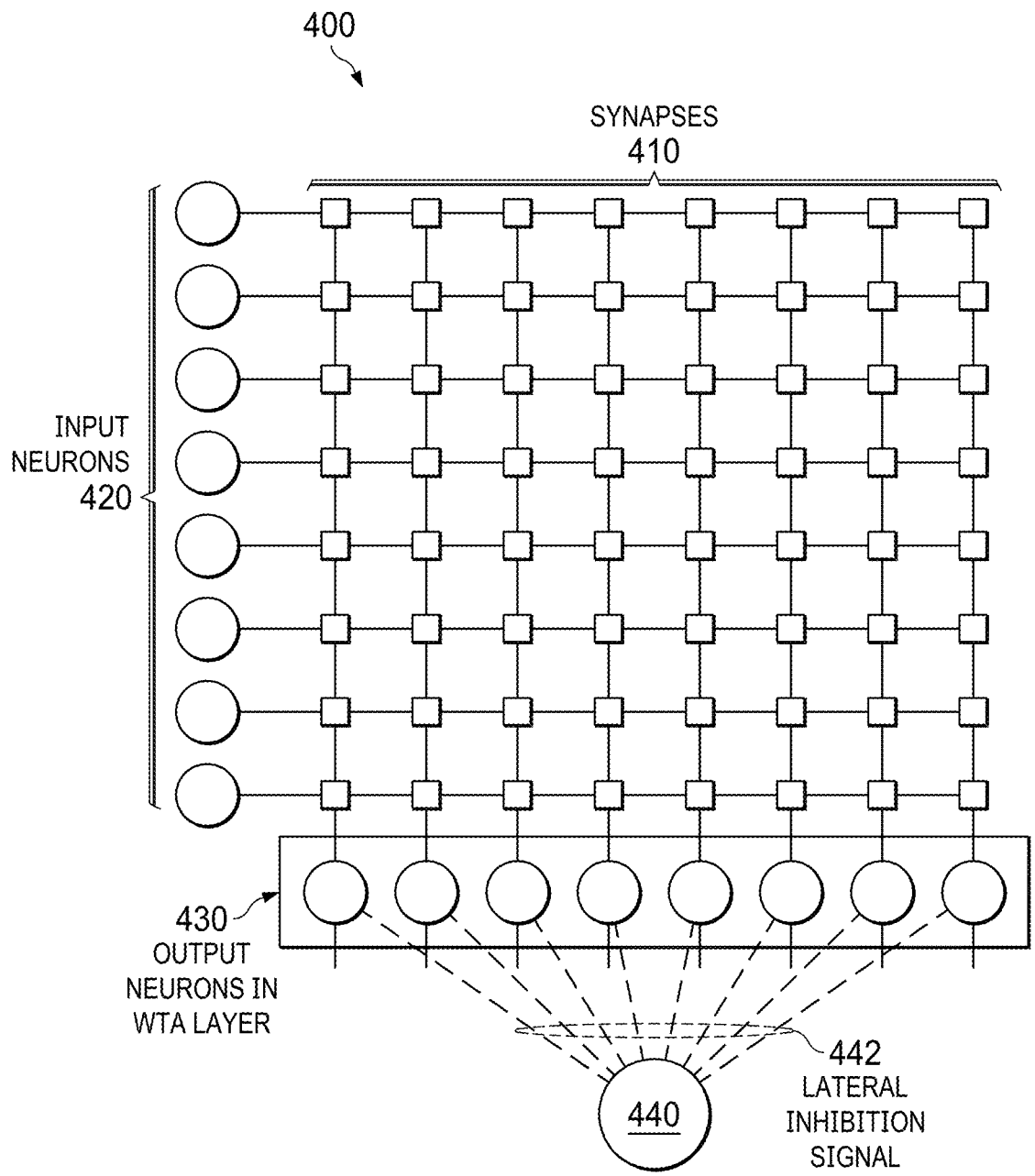
FIG. 4 illustrates a crossbar array in accordance with illustrative embodiments.

FIG. 4 illustrates a crossbar array in accordance with illustrative embodiments. Crossbar arrays enable the area-efficient integration of many devices that can be connected to vertical and horizontal wires. Similar to those frequently used in memory, many neuromorphic crossbar arrays incorporate memristors at each intersection in the array. The crossbar neural network 400 consists of synapses 410, input LIF neurons 420, and output LIF neurons 430, as shown in FIG. 4. These components are connected in an N×M crossbar array consisting of N horizontal wires (word lines) and M vertical wires (bit lines) such that the crossbar array 400 contains N+M LIF neurons and N*M synapses. Neurons 420, 430 are placed at the inputs of the word lines and at the outputs of the bit lines, respectively, while the synapses 410 are placed at the intersections between the word and bit lines. The individual states of the synapses 410 determine the electrical connectivity between the various input neurons 420 and output neurons 430, and therefore the amount of current transmitted from the input neurons 420 to the output neurons 430. Though FIG. 4 shows an 8×8 crossbar, it should be noted that the size of a crossbar array can be varied and that the structure need not be square.

Different types of devices can be used for the synapses 410. For example, synapse 410 might comprise DW-MTJ synapses, non-volatile resistive switching devices, or memristors.

Lateral inhibition is a process that allows an excited neuron to inhibit, or reduce, the activity of other nearby or connected neurons. One such neural computing system that seeks to take advantage of this is the winner-take-all system. As a form of competitive learning, artificial neurons contend for activation, meaning that only one neuron is chosen as the winner and allowed to fire, using lateral inhibition to suppress the output of all other neurons. After the winning neuron fires, the system is reset and the neurons once again compete for activation. A winner-take-all system is one of the many machine learning paradigms that take advantage of the lateral inhibition phenomenon, which is commonly used in recognition and modeling processes.

In FIG. 4 the output neurons 430 are arranged in a winner-take-all configuration. Depending on the input currents from the input neurons 420 and the weights stored in the crossbar synapses, one output neuron is chosen to fire. As all output neurons are connected, the firing of the winning neuron prevents the firing of the other neurons through lateral inhibition. After the winning neuron fires, the external node 440 emits an inhibitory signal 442, resetting the whole system.

Figure 5A:
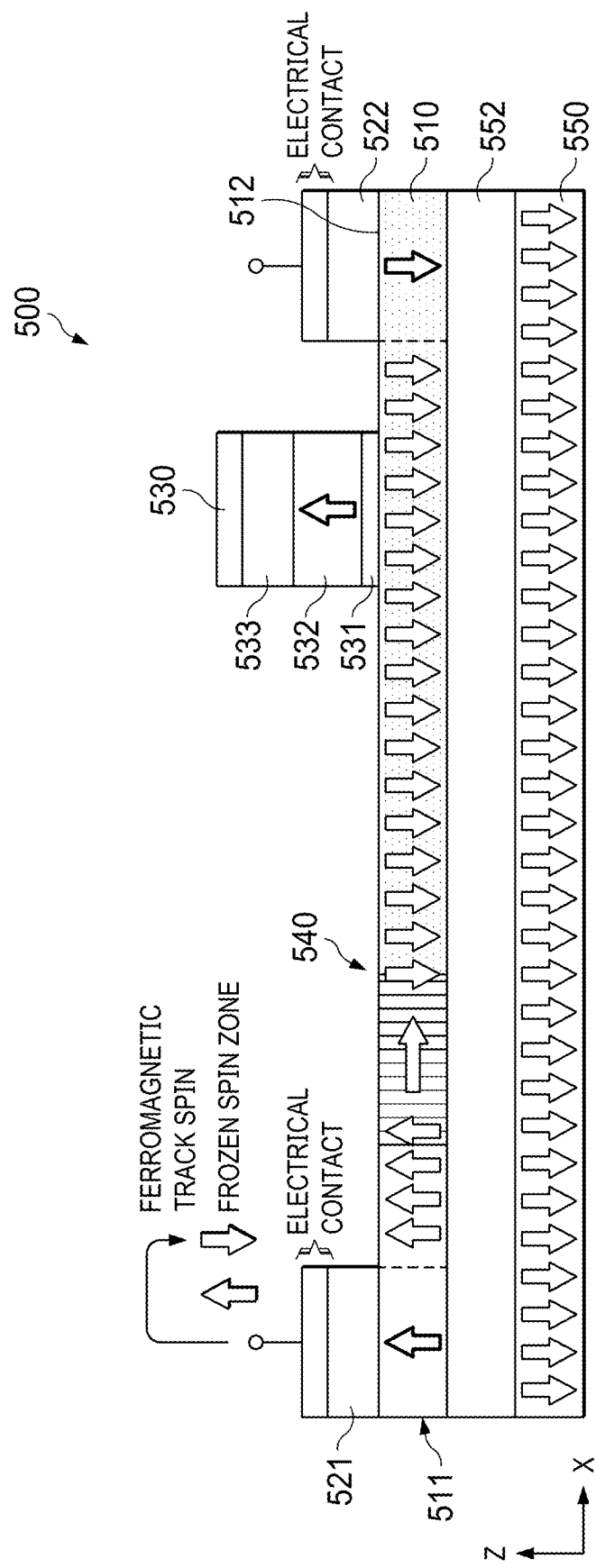
FIG. 5A illustrates a side, cross-section view of a domain wall magnetic tunneling junction device in accordance with an illustrative embodiment.
Figure 5B:
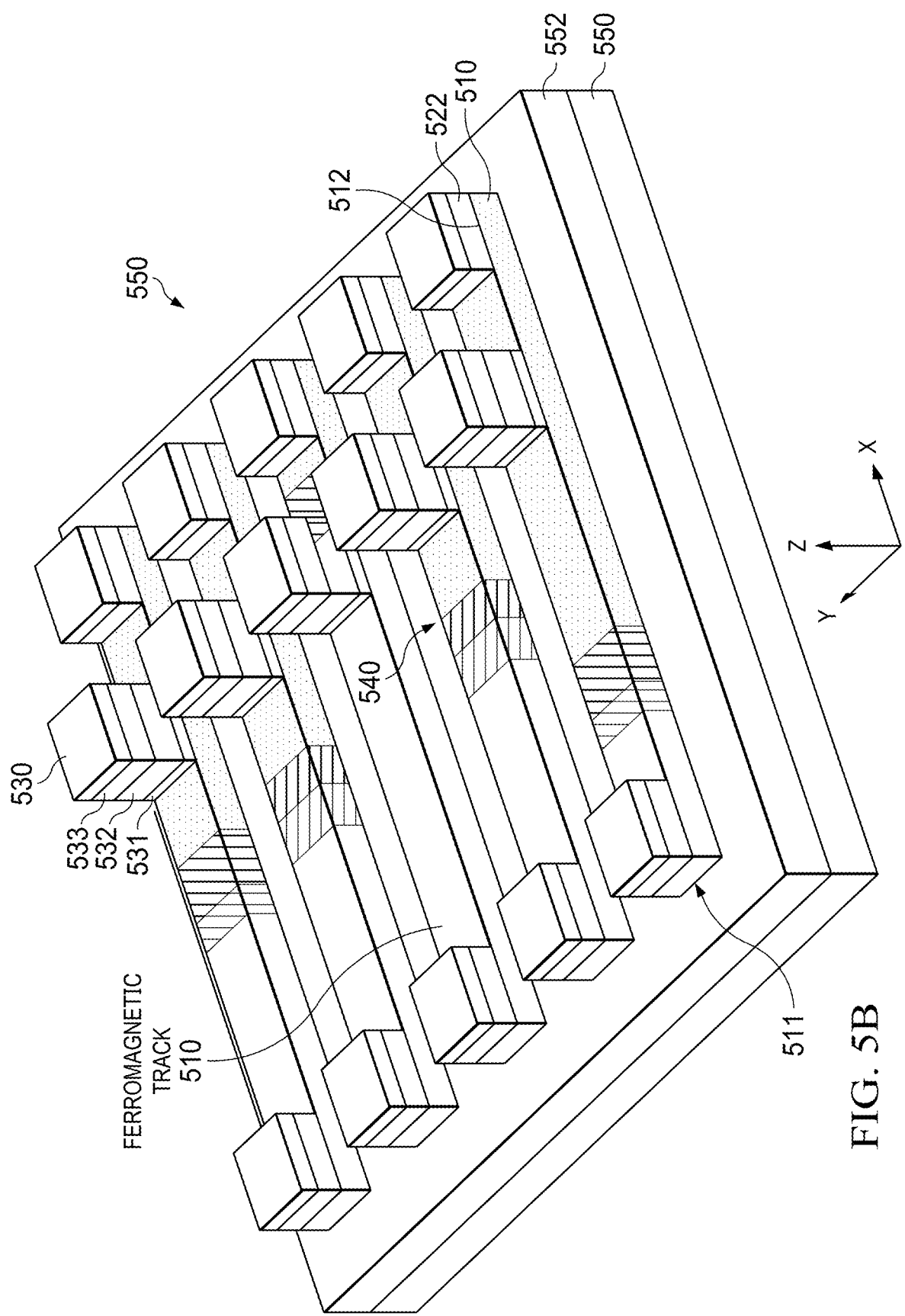
FIG. 5B illustrates a perspective view of a plurality of side-by-side DW-MTJ devices in accordance with an illustrative embodiment.

FIG. 5A illustrates a side, cross-section view of domain wall magnetic tunneling junction (DW-MTJ) device in accordance with an illustrative embodiment. FIG. 5B illustrates a perspective view of a plurality of side-by-side DW-MTJ devices in accordance with an illustrative embodiment.

The DW-MTJ device 500 comprises a soft ferromagnetic track 510 within which a magnetic domain wall (DW) 540 moves. Antiferromagnets 521, 522 at both ends contain the DW within the track 510. A magnetic tunnel junction (MTJ) 530 comprising a tunnel barrier 531, fixed ferromagnet 532, and antiferromagnet 533 is positioned over the ferromagnetic track 510, between the antiferromagnets 521, 522. The MTJ 530 is in either a high or low resistance state depending on the position of the DW 540 in relation to the MTJ. When sufficient current flows through the ferromagnetic track 510, a torque is induced on the DW 540 that causes it to move. Alternatively, spin-orbit torque can be used to provide increased efficiency; the general device behavior would be unchanged.

The DW-MTJ has previously been demonstrated experimentally and can be used to perform logical operations as well as to implement artificial synapses and neurons. These functions are performed by selective use of the three terminals of the device: writing is performed by applying a voltage between the two antiferromagnets 521, 522 such that the current flows through the track 510 to move the DW 540; reading is performed by applying voltage between the MTJ 530 and either side of the device such that the resulting current is dependent on the position of the DW 540 relative to the MTJ 530.

By adding a hard ferromagnet 550 below the DW-MTJ device, the DW-MTJ functions as a leaky integrate-and-fire neuron. The application of current causes the DW 540 to shift within the track 510 for integration. The nearby hard ferromagnet 550 causes the DW 540 to shift in the opposite direction for leaking, and firing occurs when the DW 540 passes beneath the MTJ 530. In addition, magnetostatic coupling between adjacent neurons provides the lateral inhibitory behavior which is critically important for the implementation of neural networks. The intrinsic lateral inhibition—without any peripheral overhead circuitry—enables the design of compact and energy-efficient neurons.

As shown in FIG. 5A, the neuron consists of the DW-MTJ with the addition of a hard ferromagnetic layer 550 beneath the neuron. The bottom magnet stray field affects the DW 540 through an insulating coupling layer 552 whose thickness can be chosen to optimize the proximity field. It should be noted that the method of the present disclosure is not limited to a hard ferromagnet located beneath the DWMTJ device and that other magnetic field sources that are magnetically coupled to and electrically isolated from the ferromagnetic track can be used.

The DW track modeled for this device is 600 nm, 32 nm, and 1.5 nm in the x-, y-, and z-directions, respectively. The track has perpendicular magnetic anisotropy: it is magnetized in the +z direction to the left of the DW 540 and in the −z direction to the right of the DW, as shown in FIG. 5A. The DW magnetization itself rotates in the x-y plane. At either end of the track 510, the antiferromagnets 521, 522 create regions of fixed magnetization 511, 512 with opposite directions through exchange bias that are modeled in micromagnetic simulation by 30 nm-wide regions of frozen magnetic spins. Therefore, the DW 540 is capable of moving within a 540 nm range in the track. The results described in the remainder of this work are based on Mumax3 simulations with the following magnetic parameters: saturation field value of 1 T, exchange stiffness of $13 \times 10^{-12}$ J/m, perpendicular anisotropy constant of $4 \times 10^{-3}$ J/m$^3$, polarization of spin transfer torque of 1, non-adiabaticity factor of 0.9, Landau-Lifshitz damping constant of 0.015, and discretization cell size of $1 \times 1 \times 1$ nm$^3$.

The leaking functionality is implemented by a 20 mT magnetic field produced by the ferromagnet 550 beneath the DW track 510 in the −z direction. This produces a constant force that results in the DW 540 shifting in the −x direction. In the absence of current and under the sole influence of the magnetic field, the DW 540 shifts in the −x direction toward magnetization region 511 as can be seen from FIGS. 6A-6C.

Figure 6A:
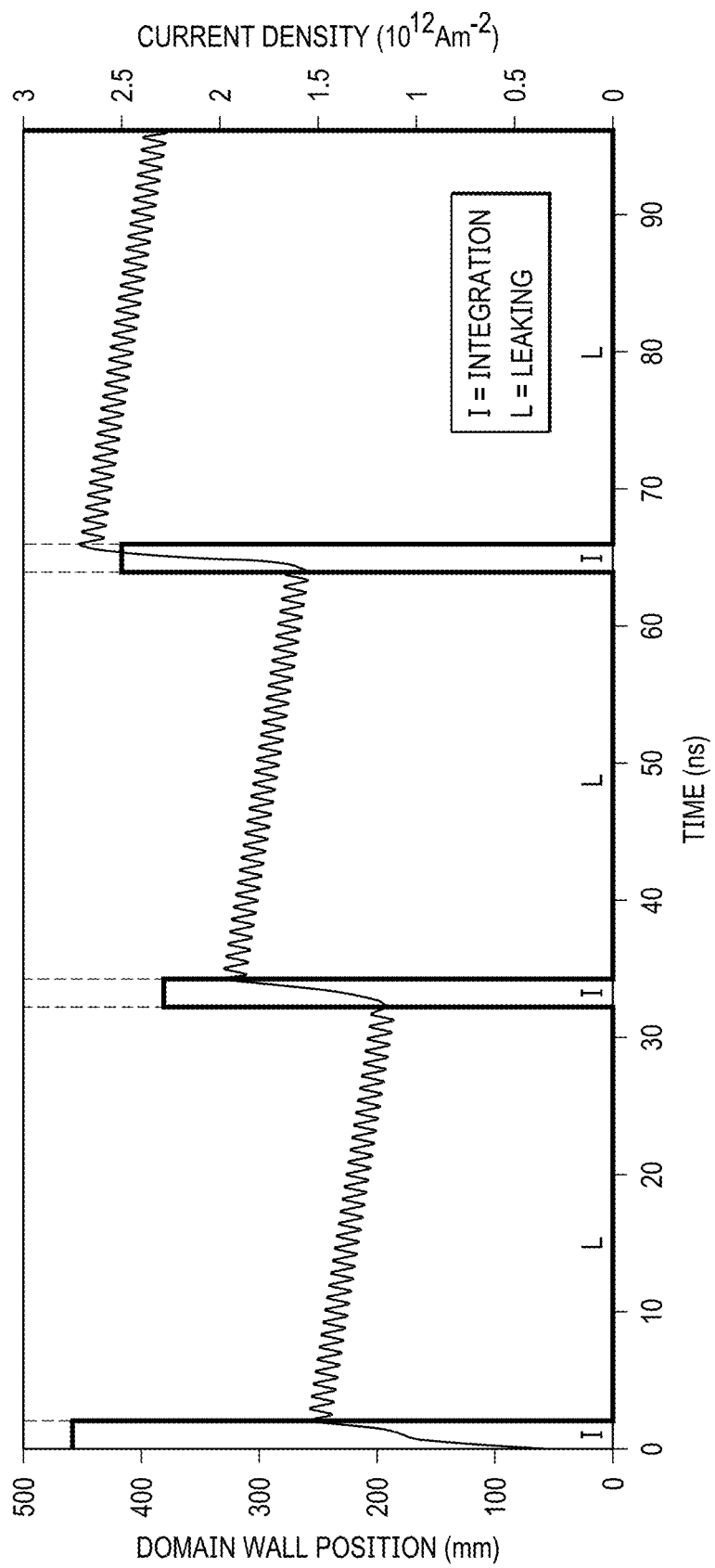
FIG. 6A illustrates a graph of the leaking and integration of a DW-MTJ neuron in accordance with an illustrative embodiment.
Figure 6C:
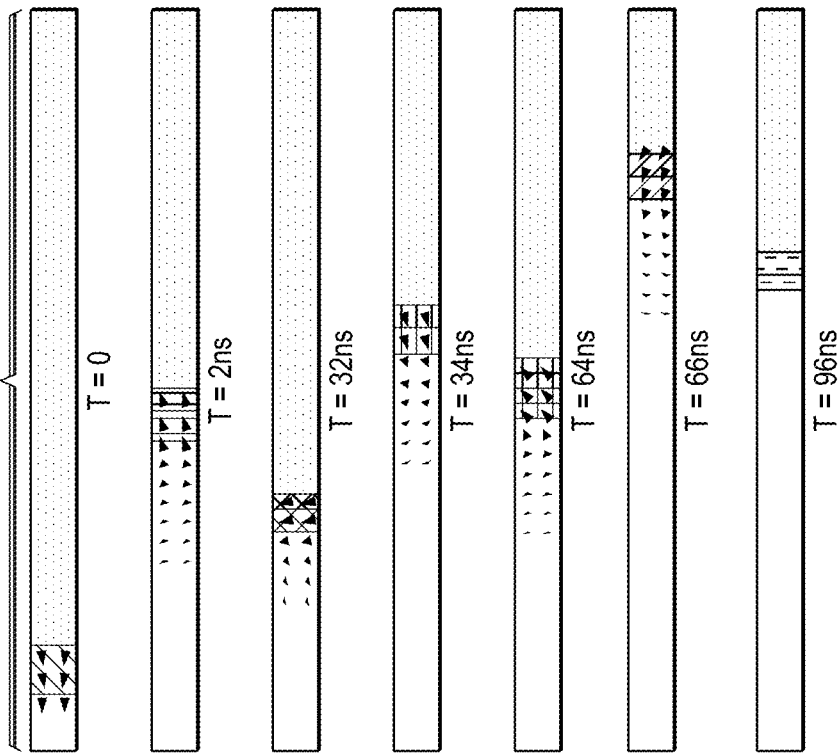
FIG. 6C illustrates the movement of the domain wall over time due to integration of signals and leaking in accordance with an illustrative embodiment.

FIG. 6A illustrates a graph of the leaking and integration of a DW-MTJ neuron in accordance with an illustrative embodiment. The oscillatory DW motion is a result of precession of the DW under the magnetic field. In the absence of an applied current, the DW traverses the entire available track in around 220 ns, which corresponds to an average velocity of 2.5 m/s.

A primary advantage of this leaking technique is that no external excitations are required to drive the leaking mechanism: the hard ferromagnet beneath the DW track continuously provides the required magnetic field. Whereas other proposed neuron leaking schemes require the use of a small leaking current flowing through the neuron that results in resistive power dissipation, the present leaking scheme avoids this power dissipation by replacing the leaking current with a constant magnetic field supplied by a fixed ferromagnet or other magnetic field source. Furthermore, as no external excitations must be applied by an external control circuit to perform leaking, the proposed leaking scheme avoids the hardware costs associated with overhead circuits.

Figure 6B:
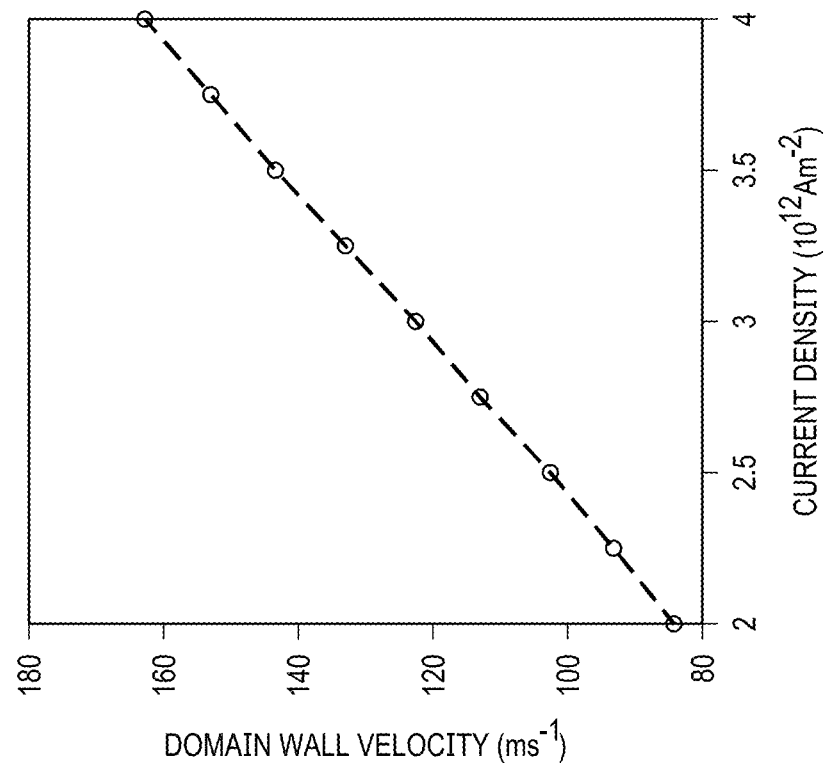
FIG. 6B illustrates a graph depicting the relationship between DW velocity and current density

FIG. 6B depicts the relationship between DW velocity and current density. In order to integrate the input current and eventually cause the neuron to fire, current applied to the DW track above the $\sim 2 \times 10^{12}$ A/m$^2$ threshold current overcomes the leaking field and causes the DW to shift in the +x direction. FIG. 6A therefore demonstrates the ability of the DW-MTJ neuron to both integrate and leak without any external circuitry. As the integration is significantly faster than the leaking, this artificial neuron can continually integrate infrequent input signals that push the DW further and further in the +x direction. This can be seen further in FIG. 6C, which illustrates the movement of the domain wall over time due to integration of signals and leaking.

In the firing operation, the neuron generates an output spike while resetting all the neurons in the same layer to enforce a refractory period during which these neurons cannot fire. The DW-MTJ achieves this through use of the MTJ formed by the track 510, tunnel barrier 531, and pinned ferromagnet 531 above the track as shown in FIG. 5A. When the DW 540 moves sufficiently in the +x direction such that the magnetization direction of both the ferromagnetic track 510 and the pinned ferromagnet 532 is in the +z direction, the MTJ resistance is switched from high to low. This resistance switching can generate an output firing spike and be used as an output signal or propagate to cascaded synapses. In addition, the output firing spike can also trigger a peripheral circuit that resets the neuron by sending a current in the direction opposite to the integrating current. This reset current, in concert with the leaking magnetic field, rapidly resets the neurons to prepare for the next set of inputs from the synapses.

Figure 7:
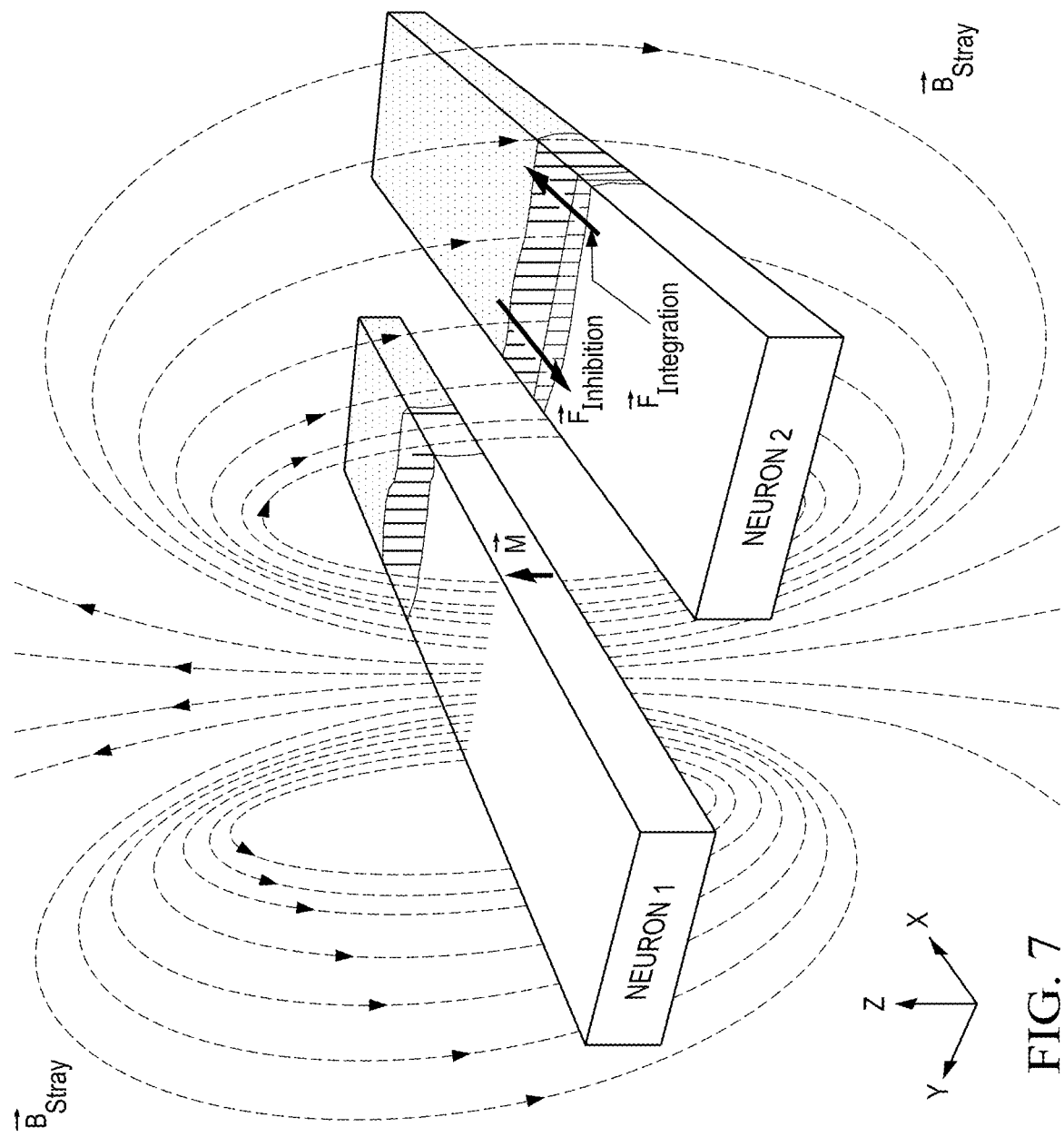
FIG. 7 illustrates lateral inhibition in accordance with illustrative embodiments.

FIG. 7 illustrates lateral inhibition in accordance with illustrative embodiments. In neuroscience, the relation between two neurons can be such that the excitation of one neuron inhibits the other neuron from firing. This mechanism is referred to as lateral inhibition. For neighboring ferromagnetic tracks above a shared fixed ferromagnet (or within a shared magnetic field), as depicted in FIG. 5B, the motion of a DW can be inhibited by the stray fields from neighboring neurons. In particular, each ferromagnetic track creates a dipolar electric field that attempts to orient neighboring neurons antiparallel (repulsive coupling). This pushes a slower neighboring DW in the opposite direction and thus laterally inhibits the slower neuron. To induce repulsive coupling, the neighboring tracks should be polarized as shown in FIG. 7.

The DW-MTJs provide lateral inhibition with the DW velocity of a particular ferromagnetic track dependent on the current flowing through neighboring tracks. The stray magnetic field from neuron 1 pushes the DW of neuron 2 in the −x direction, impeding the +x directed integration. Neuron 2 also produces stray magnetic fields (not shown) that influence neuron 1.

Figure 8:
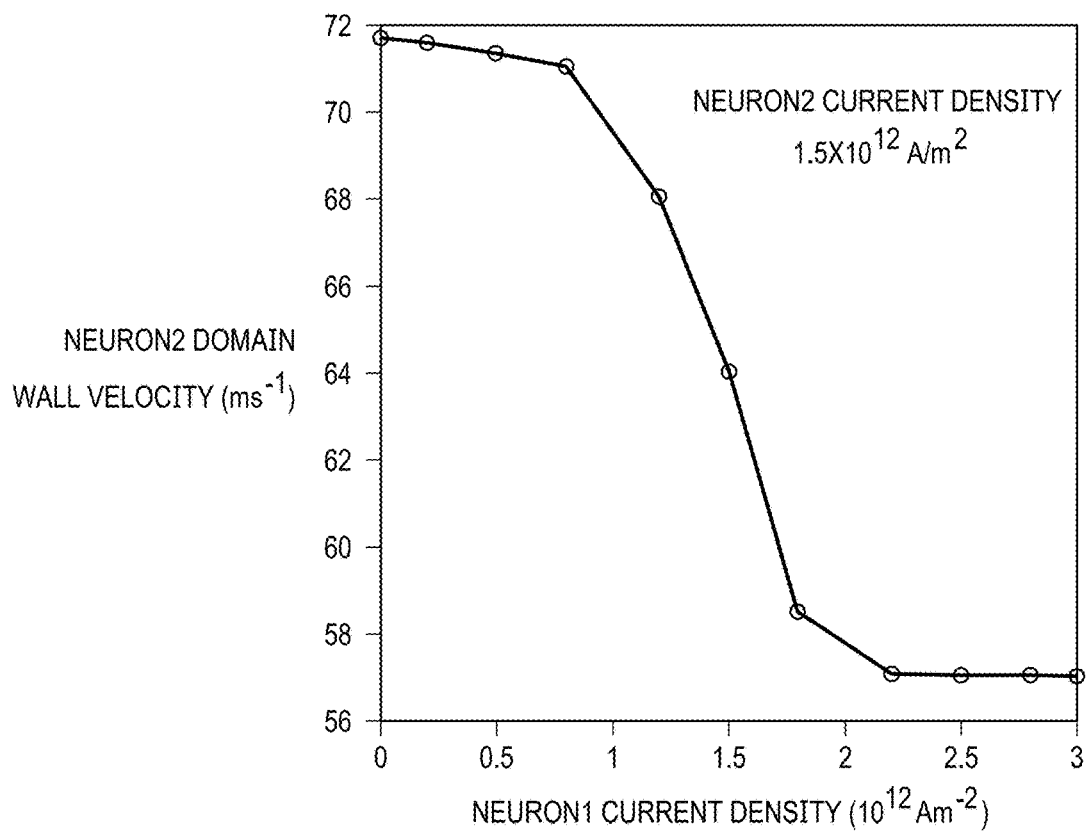
FIG. 8 illustrates the relationship between the DW velocity of a particular track with its neighboring track current density in accordance with illustrative embodiments.

FIG. 8 illustrates the relationship between the DW velocity of a particular track with its neighboring track current density in accordance with illustrative embodiments. A $1.5 \times 10^{12}$ A/m$^2$ fixed current density is applied through ferromagnetic neuron2 while the current density through neuron1 is varied between 0 and $3 \times 10^{12}$ A/m$^2$. When neuron1's current density increases beyond the neuron2's current density, neuron2's DW velocity is significantly reduced.

Figure 9A:
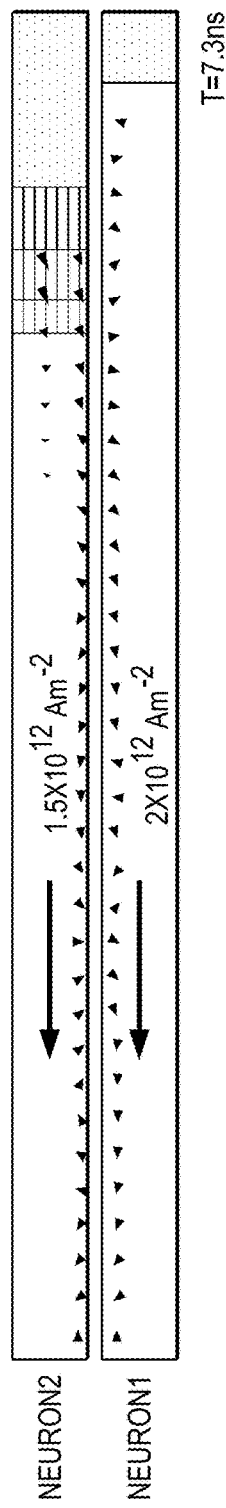
FIG. 9A illustrates micromagnetic simulation snapshots of two z-axis-polarized ferromagnetic tracks in accordance with an illustrative embodiment.
Figure 9B:
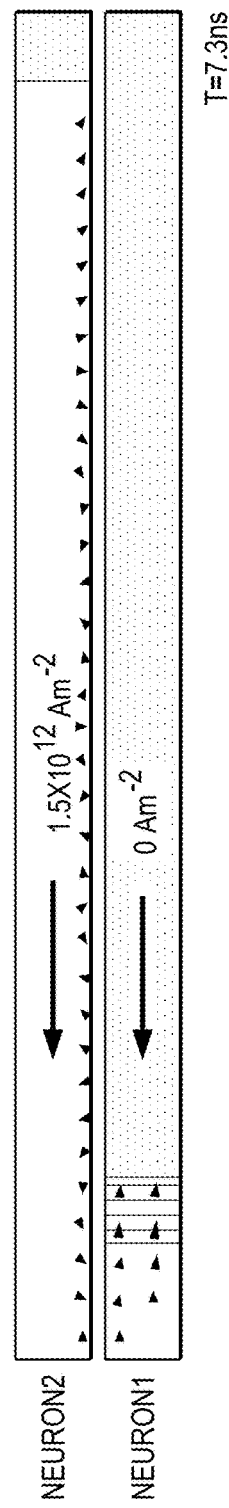
FIG. 9B illustrates micromagnetic simulation snapshots of two z-axis-polarized ferromagnetic tracks in accordance with an illustrative embodiment.

FIGS. 9A and 9B illustrates micromagnetic simulation snapshots of two z-axis-polarized ferromagnetic tracks in accordance with an illustrative embodiment. Two ferromagnetic tracks are separated by 6 nm along the y direction, with two different sets of applied current densities. In FIG. 9A $1.5 \times 10^{12}$ and $2 \times 10^{12}$ Am$^{-2}$ are applied along the top (neuron2) and bottom (neuron1) tracks, respectively.

In FIG. 9B $1.5 \times 10^{12}$ and 0 Am$^{-2}$ current densities are applied, respectively, thus enabling the DW to reach the right end point earlier than in FIG. 9A. In this case, the inhibitory property of neuron1 is diminished by applying no current through it. Thus, due to the lack of inhibition in this situation, neuron2's DW can reach the right end point of the track earlier than in FIG. 9A. The snapshots are taken 7.3 ns after the application of current.

Figure 10A:
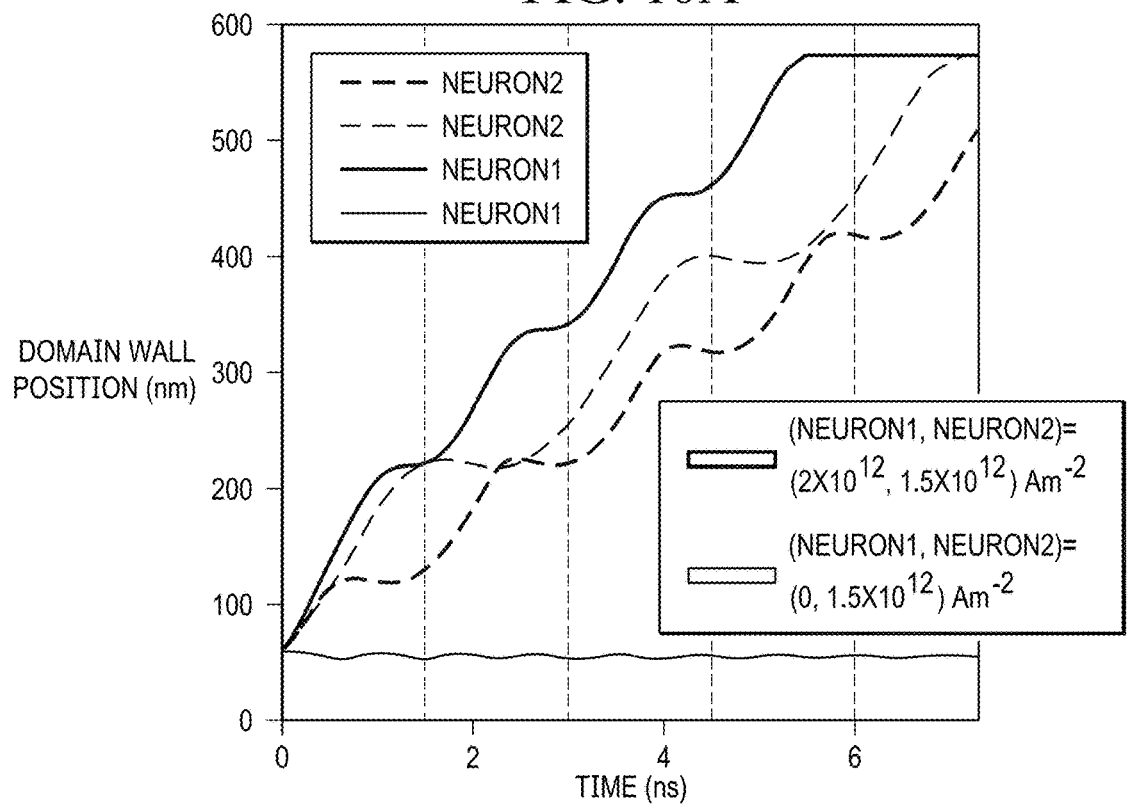
FIG. 10A illustrates a graph depicting the relationship between domain wall position and time in accordance with an illustrative embodiment.

FIG. 10A illustrates a graph depicting the relationship between domain wall position and time in accordance with an illustrative embodiment. FIG. 10A shows DW position versus time, demonstrating the ability of neuron1 to inhibit the motion of neuron2. The relatively slower motion of neuron2 in the situation in FIG. 9A as compared to the situation in FIG. 9B is a clear indication of lateral inhibition.

Figure 10B:
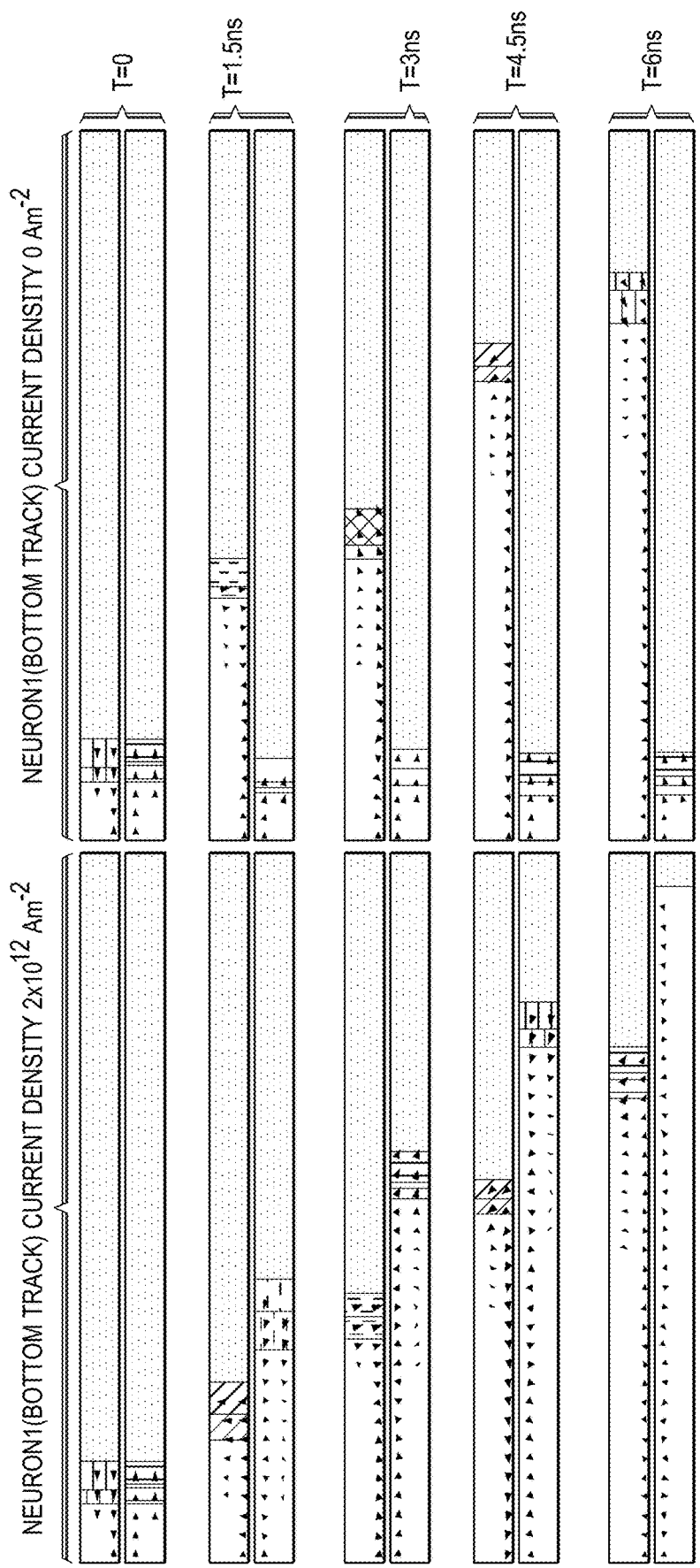
FIG. 10B illustrates domain wall propagation of laterally inhibited neurons in accordance with an illustrative embodiment.

FIG. 10B illustrates domain wall propagation of laterally inhibited neurons in accordance with an illustrative embodiment. FIG. 10B shows snapshots of the DW propagation at an interval of 1.5 ns for the two current density sets. Each set of images corresponds to a time marked by the dashed lines in FIGS. 9A and 9B. This snapshot is the first demonstration of intrinsic lateral inhibition between artificial neurons without external circuitry.

To verify the effectiveness of this system, the well-known handwritten digit recognition test is run with micromagnetic simulation. 8×8 resolution handwritten digits are sourced from the scikit-learn database and run through a synapse crossbar, with the first neuron to fire determining the classification of the digit. Overall, the system had a 94% accuracy in selecting the correct winning neuron that corresponded with the currents provided by the synapse array.

In order to evaluate the behavior of the proposed spintronic neurons in a larger nanoelectronic environment, an actual data science task was presented to a simulated memristive crossbar of generic nanodevice synapses. The chosen data science task was the digits database imported from the Python library scikit-learn, which is a downsampled version of the classic MNIST database (64 instead of 784 input features). The database consists of 1797 total samples of handwritten digits in 10 separated classes. The simulated crossbar learns using a binary adaptation of the classic Widrow-Hoff learning algorithm; the analog input features are mapped to the voltage domain and presented in a sign-symmetric fashion such that each component of the input Xi feeds into a positive line Xi+ and a negative line Xi−. Considering the bias lines and the ten different classes of outputs, the simulated crossbar has a dimensionality of 130 input wires and ten output wires.

Before learning, the database is separated into a training set of 1300 samples and a testing set of 497 samples, which are never mixed. During a separated training phase consisting of ten epochs of shuffled presentation of the training dataset, the conductance of all synapses in the array is progressively adapted in order to minimize training error. During the testing phase, the trained crossbar performs inference. Electrically, the unknown digits are presented to the input wires and ten output currents are automatically obtained at the output.

Large-scale micromagnetic simulations of an array of ten of these neurons are simulated to demonstrate the effectiveness of this neuron for neuromorphic applications. Each of the ten neurons represents the recognition of one digit, and their 20 nm separation is close enough for lateral inhibition to occur. While this 20 nm separation represents an aggressive scaling target, it can be achieved using high-resolution lithography processing; magnetic tunnel junctions have been patterned down to 20 nm diameter with on/off ratios greater than 100%, and block copolymer methods have resulted in close-packed magnetic tunnel junction disks with 13 nm separation.

The lateral inhibition, in this system, implements a "winner take all" functionality—if one of the neurons has a higher input current than the others, the current flowing through the other neurons is insufficient to shift the DW against the spin transfer torque. This ensures that only one neuron is able to fire at a time. To test the effectiveness of this system, we apply the output currents attained from the method described above. Before these current density values are used, they are normalized to the acceptable neuron current range of $1.5 \times 10^{12}$ to $4 \times 10^{12}$ A/m². After normalization, the currents can be applied to each of the ten devices as the integrating input current. Once the DW has shifted along 95% of the track and across the MTJ, the MTJ resistance switches and the neuron fires. The firing mechanism sends a current to reset the neurons as soon as one DW position traverses the MTJ. Finally, there is a leaking phase at the end of the simulation, to demonstrate the leaking ability of the device, which along with the reset current represents the refractory period. The application of each input number lasts a constant time of 30 ns, with the time of the leaking phase varying depending on the time of the integrating phase.

Figure 11A:
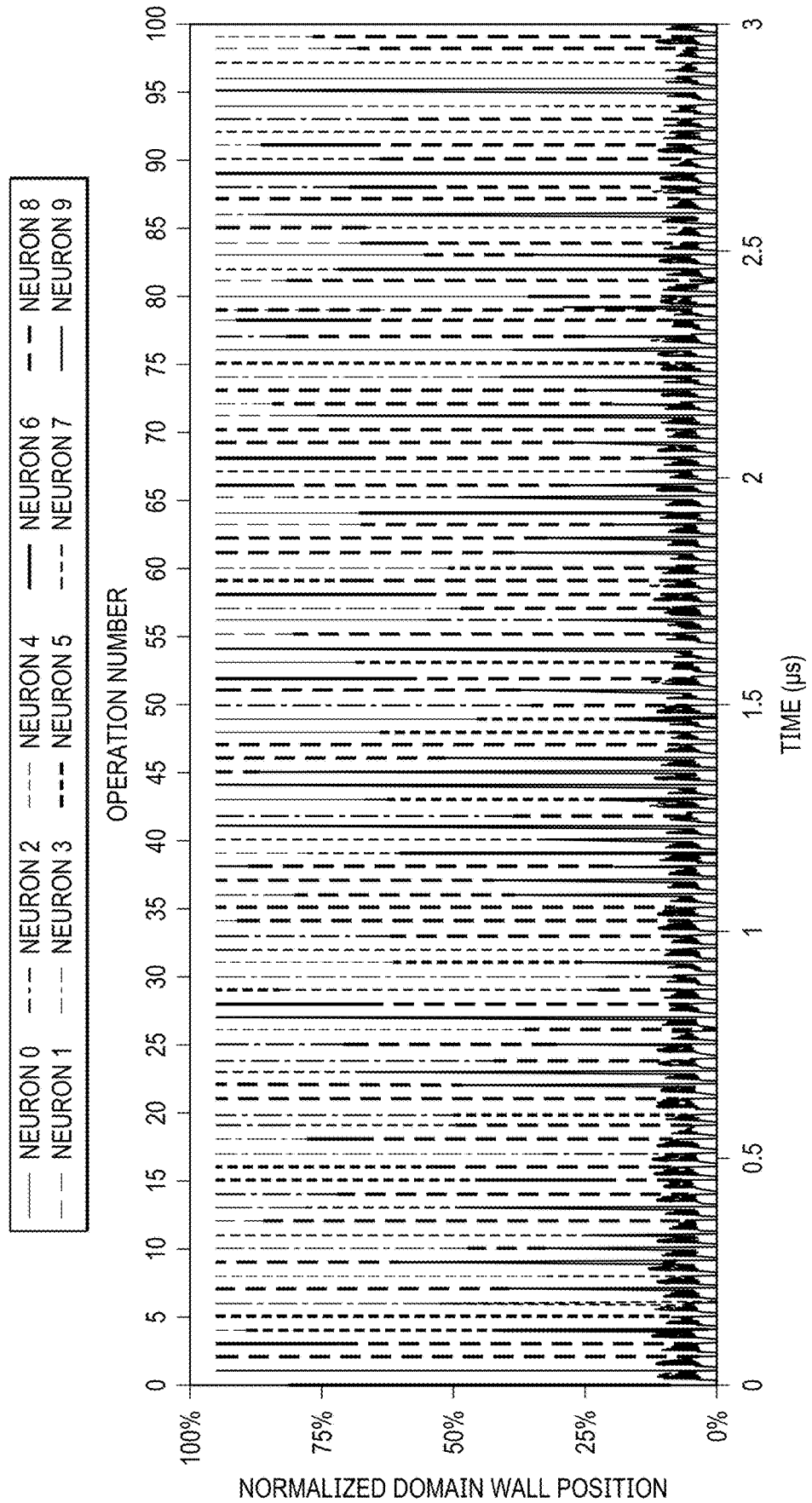
FIG. 11A illustrates a graph of simulation results of a laterally-inhibited, ten-neuron, winner-take-all output layer in accordance with an illustrative embodiment.

FIGS. 11A-11D illustrate simulation results of a laterally-inhibited, ten-neuron, winner-take-all output layer in accordance with an illustrative embodiment. FIG. 11A displays the results in graph form, after 100 cycles have run. Each simulation lasts for 30 ns, with each spike representing one digit. The winner of each cycle can be seen by which color reaches the end of the track (in this case, the 95% mark), with each color corresponding with a neuron.

Figure 11B:
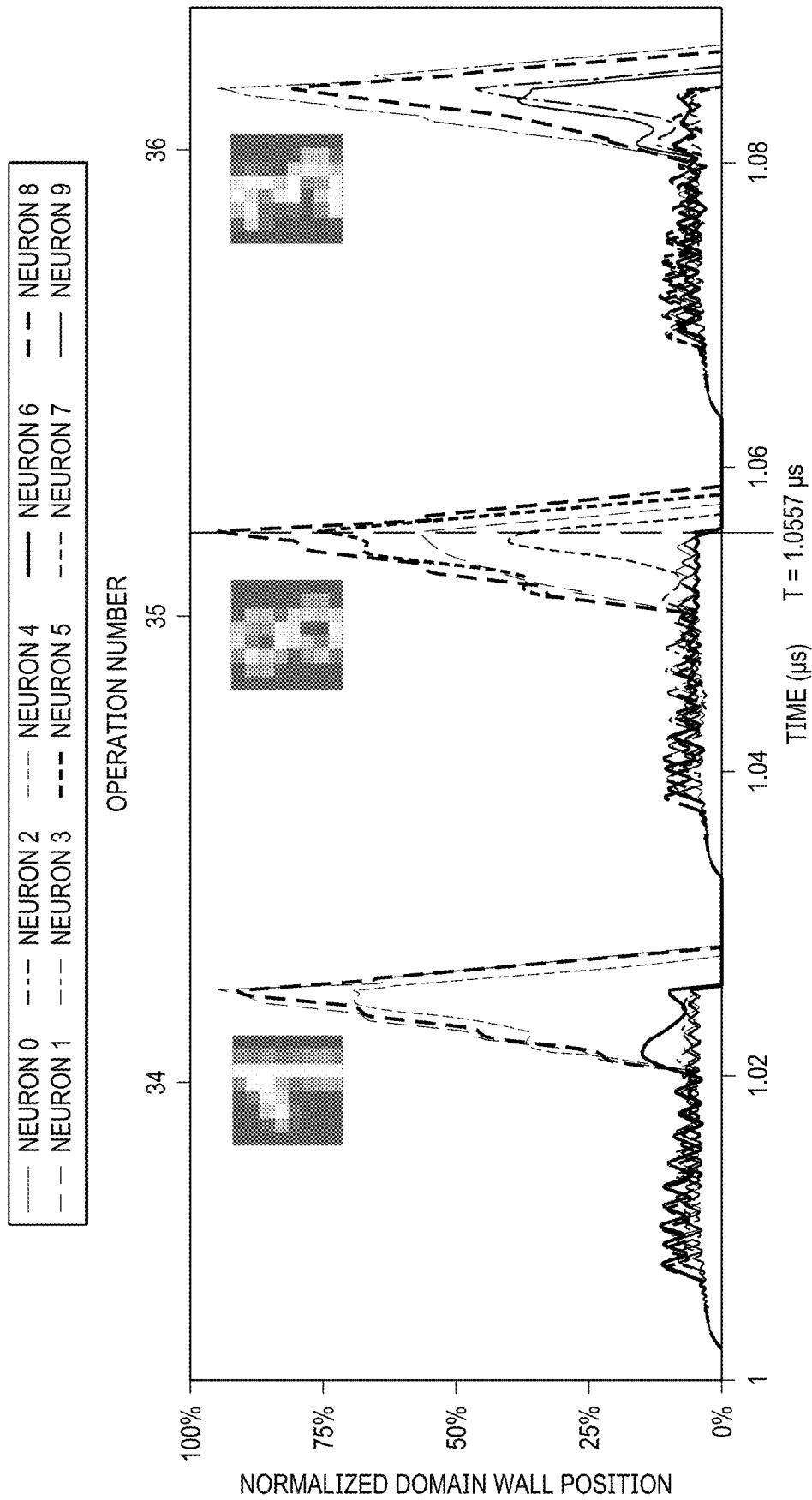
FIG. 11B illustrates a zoomed-in portion of the graph in FIG. 11A with the original input images.

For a clearer representation of three cycles, a zoomed-in version is provided in FIG. 11B along with the original input image in order to add context to what was being identified.

Figure 11C:
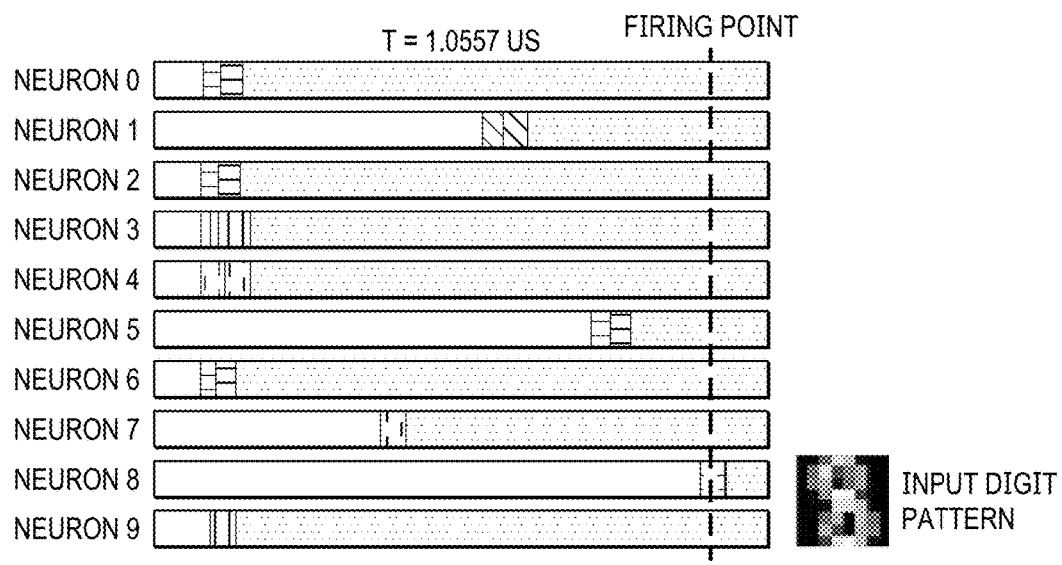
FIG. 11C provides a visualization of the laterally-inhibited, winner-take-all graph data in FIG. 11A.

FIG. 11C provides a visualization of the graph data, showing a Mumax3 simulation snapshot. This figure only represents only one cycle of graph data, at the climax of the firing phase. The 8×8 input image is provided below, to provide context on the handwritten digit being identified by the system. In this case, since neuron #2 fired, the system correctly identified the image.

Figure 11D:
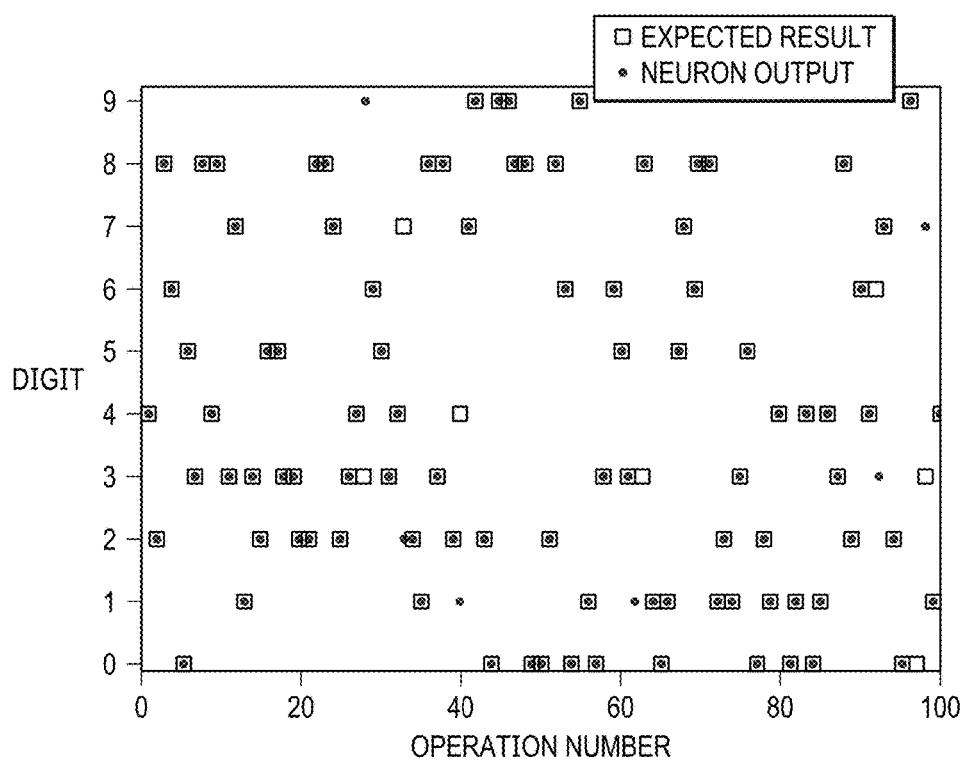
FIG. 11D shows a plot of expected results vs. output digit of laterally-inhibited, ten-neuron, winner-take-all output layer in accordance with an illustrative embodiment.

FIG. 11D shows a plot of expected results vs. output digit. Every input digit data point that is visible is therefore a failed classification. When the output matches the input, they overlap. This system had a 94% accuracy in selecting the correct winning neuron that corresponded with the currents provided by the synapse array. Similar to other neuromorphic systems, this neuron output layer is highly tolerant to fabrication imprecision.

Figure 12A:
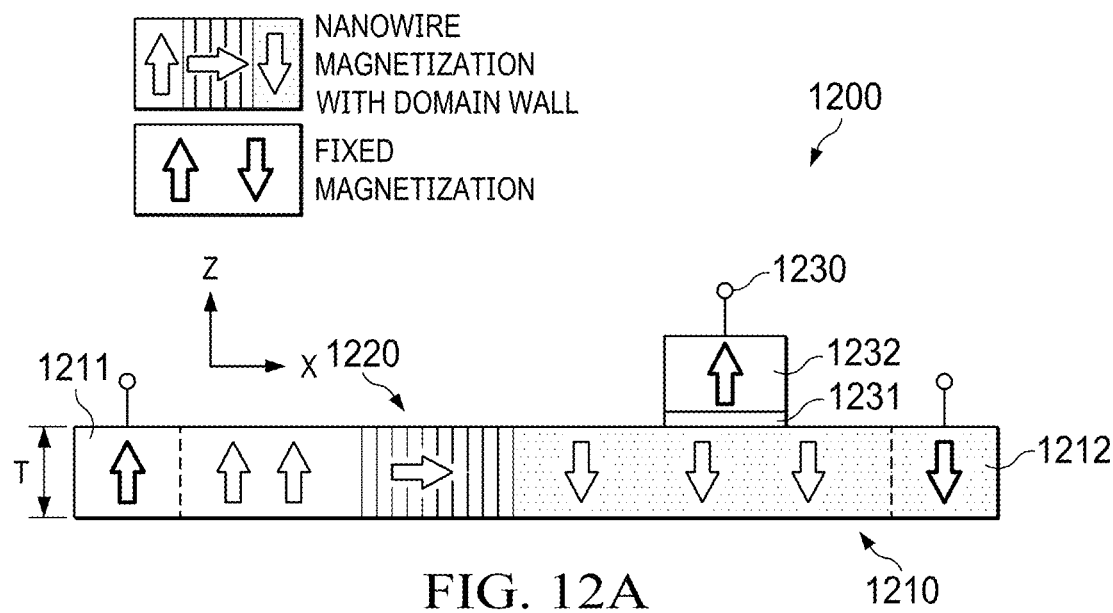
FIG. 12A illustrates a side, cross-section view of a three-terminal, magnetic tunnel junction (3T-MTJ) device with a trapezoidal ferromagnetic track in conjunction with an illustrative embodiment.
Figure 12B:
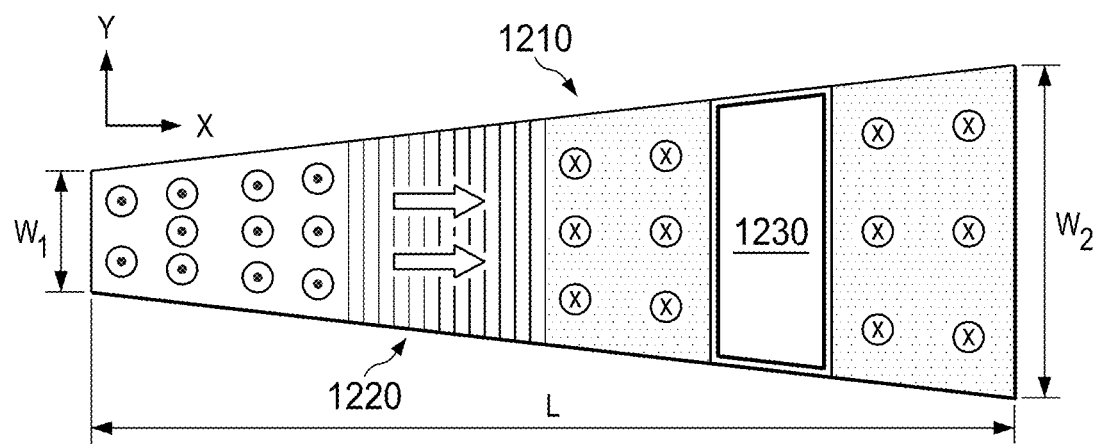
FIG. 12B illustrates a top plan view of a three-terminal, magnetic tunnel junction (3T-MTJ) device with a trapezoidal ferromagnetic track in conjunction with an illustrative embodiment.

FIG. 12A illustrates a side, cross-section view of a three-terminal, magnetic tunnel junction (3T-MTJ) device 1200 with a trapezoidal ferromagnetic track in conjunction with another illustrative embodiment. FIG. 12B illustrates a top plan view of device 1200. Similar to the device 500 in FIGS. 5A and 5B, device 1200 includes a ferromagnetic track 1210 with fixed magnetizations regions 1211, 1212 with opposite directions at each end of the track. A MTJ 1230 comprising a tunnel barrier 1231 and ferromagnet 1232 is located between the fixed magnetic regions 1211, 1212.

However, this embodiment comprises a ferromagnetic track 1210 having a trapezoidal x-y cross-section, as shown in FIG. 12B, instead of a rectangular x-y cross-section. Similar to the conventional 3T-MTJ, there is a Néel DW 1220, in which a magnetization is in the +z-direction to the left of the DW 1220, and the −z-direction to the right of the DW.

Micromagnetic simulations were performed with Mumax3, with length L of 250 nm, left-hand width W1 of 25 nm, right-hand width W2 of 100 nm, and thickness t of 1.5 nm. The fixed magnetizations 1211, 1212 at either end of the ferromagnetic nanowire cover 10 nm from each edge, providing the DW 1220 with a 230 nm range of motion. The material parameters represent CoFeB, with an exchange stiffness $A_{ex}$ of $13 \times 10^{-12}$ J/m, a Landau-Lifshitz-Gilbert damping constant α of 0.05, a non-adiabaticity factor ξ of 0.05, a magnetic saturation value $M_{sat}$ of 1 T, and a uniaxial anisotropy in the z-direction with a magnitude of $5 \times 10^5$ J/m³. The cell size is 1×1×1.5 nm³, and the external magnetic field $B_{ext}$ is 0 T everywhere. The COMSOL multiphysics simulator was used to determine the electrical current density through this trapezoidal structure.

Because of the trapezoidal structure of the ferromagnetic nanowire 1210, the energy of a DW 1220 is dependent on the position of the DW along the length of the track. In particular, the DW energy depends on the shape anisotropy of the magnetic material, and the asymmetric shape modifies the demagnetization factor of the magnetic structure. The DW energy is highest where the width is largest, and is lowest where the width is smallest. Therefore, in order to minimize the DW energy, the DW 1220 autonomously moves leftward from higher-energy positions at the right (wide) side of the wire to lower-energy positions at the left (narrow) side of the wire.

Figure 13A:
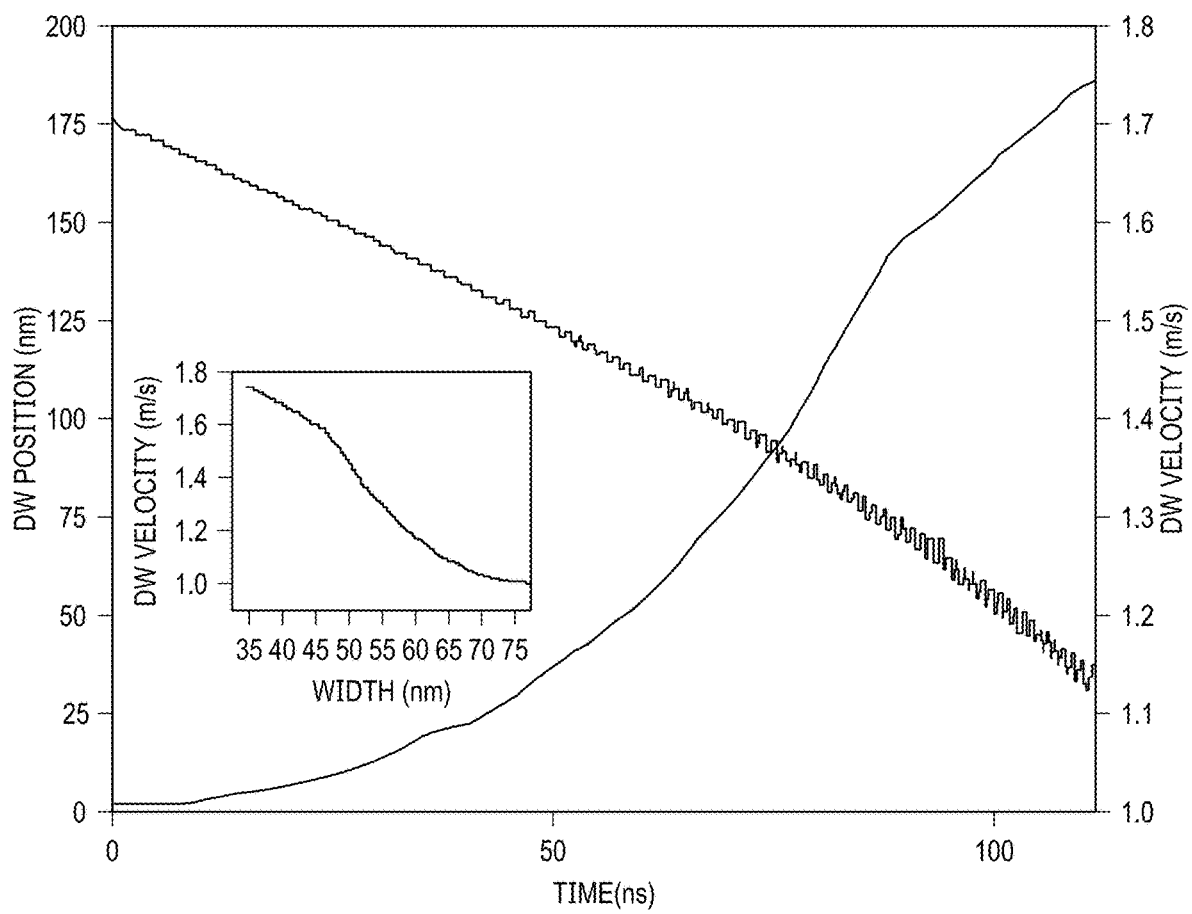
FIG. 13A illustrates a graph of DW position and velocity as functions of time with no external stimuli in accordance with an illustrative embodiment.
Figure 13B:
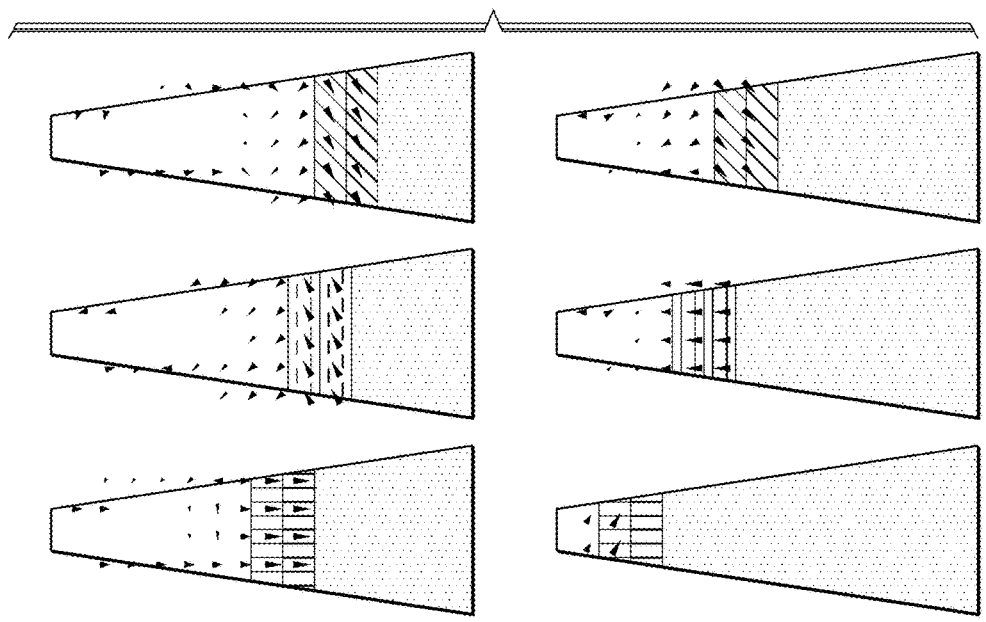
FIG. 13B illustrates micromagnetic snapshots of DW drift with no external stimuli in accordance with an illustrative embodiment.

FIGS. 13A and 13B illustrate shape-based domain wall drift with no external stimuli in accordance with an illustrative embodiment. The DW is initialized 175 nm from the narrow left edge of the nanowire track (75 nm from the wide right edge), and gradually drifts towards the narrow left edge. No electrical current or magnetic field is applied. The DW precesses as it drifts, generating the ripple seen in the position over time; the DW maintains a steady-state position while continually precessing once it reaches the stable position 28 nm from the left edge. It can further be seen that the DW velocity increases as the DW approaches the narrow edge of the nanowire.

FIG. 13A shows position and instantaneous velocity of the DW as functions of time. The inset shows velocity as a function of the DW width. The position was calculated based on the minimum of the absolute value of the z-directed magnetization along the central axis of the nanowire length; the velocity was determined from DW position with moving averages to smoothen the effects of precession. FIG. 13B show micromagnetic simulation snapshots for: (b) t=0, (c) t=22 ns, (d) t=44 ns, (e) t=66 ns, (f) t=88 ns, and (g) t=110 ns.

The field-free and current-free movement of the DW from a wider to narrower region of the ferromagnetic track depends on the energy difference of the demagnetization field due to the asymmetric shape compared to the pinning energy of the DW due to intrinsic and extrinsic defects in the wire, for example from dopants and edge roughness. The simulations described herein were performed at zero temperature in a perfect wire without these pinning effects. Experimental demonstration of the proposed neuron at room temperature should therefore be feasible with a sufficiently pristine nanowire.

The shape-based DW drift provides a native representation of neuron leaking that enables simplification of the device structure. Whereas previous spintronic neuron proposals have required external currents, magnetic fields, or additional device layers, the shape-based DW drift enables an artificial 3T-MTJ neuron with an intrinsic leaking capability. The integration and firing capabilities are retained in a manner similar to previous proposals, rounding out the requirements for an LIF neuron.

Figure 14:
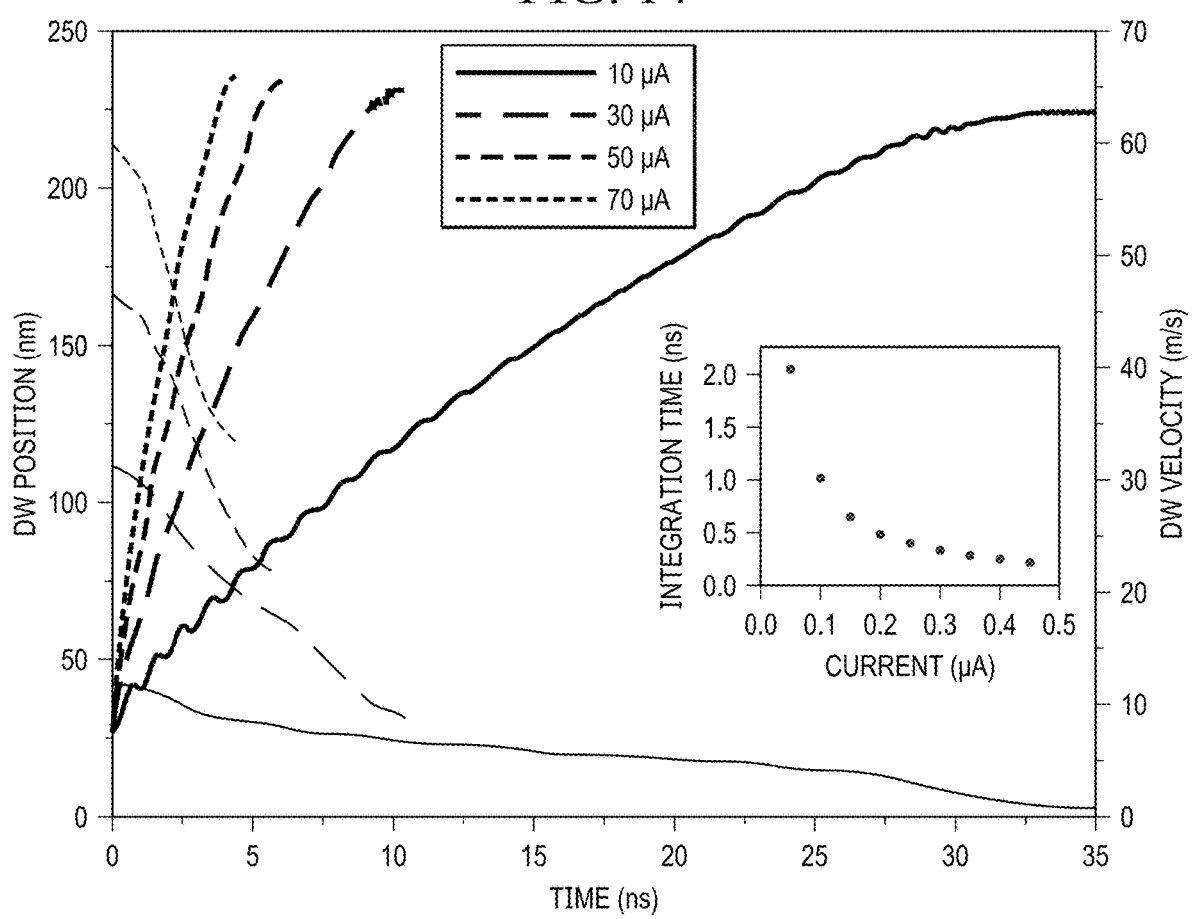
FIG. 14 illustrates position and instantaneous velocity of the DW for various currents in accordance with an illustrative embodiment.

FIG. 14 illustrates position and instantaneous velocity of the DW for various currents in accordance with an illustrative embodiment. Positions are represented as solid curves, while velocities are represented by dashed curves. The inset shows the time taken for a DW to shift 100 nm from the stable position (28 nm from the left edge of the device) as a function of the current passed through the DW track. Current through the device is integrated through motion of the DW. The DW velocity is dependent on the applied current as shown in FIG. 14, with larger currents causing faster integration of the externally-applied signal. With this trapezoidal prism, the DW velocity is also influenced by the width, as discussed previously in relation to the leaking; the DW moves faster where the width is smaller.

Figure 15A:
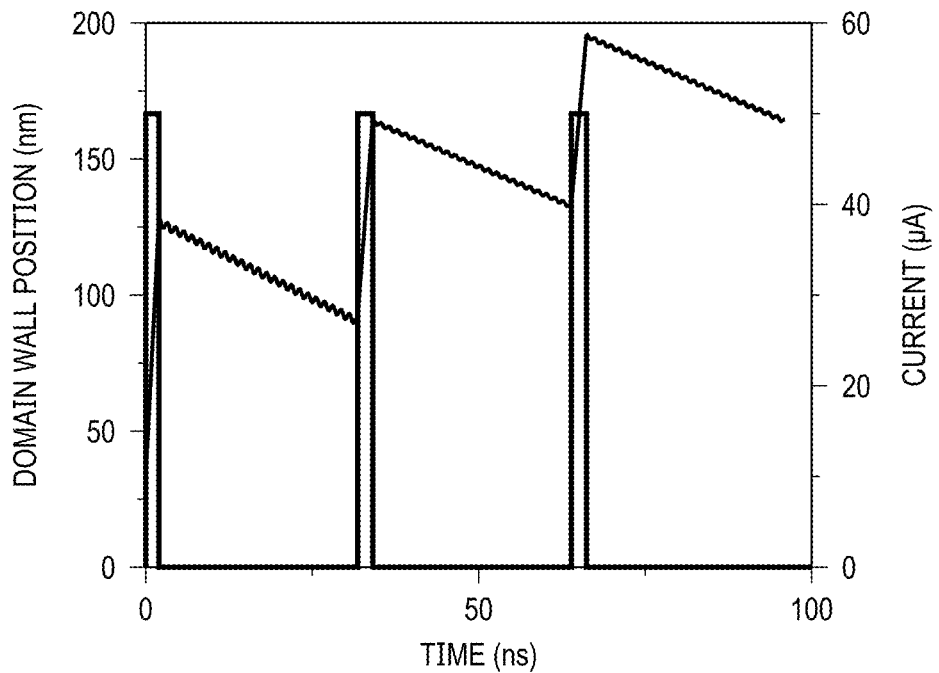
FIG. 15A illustrates a graph of combined integration and leaking behavior of the trapezoidal neuron in accordance with an illustrative embodiment.
Figure 15B:
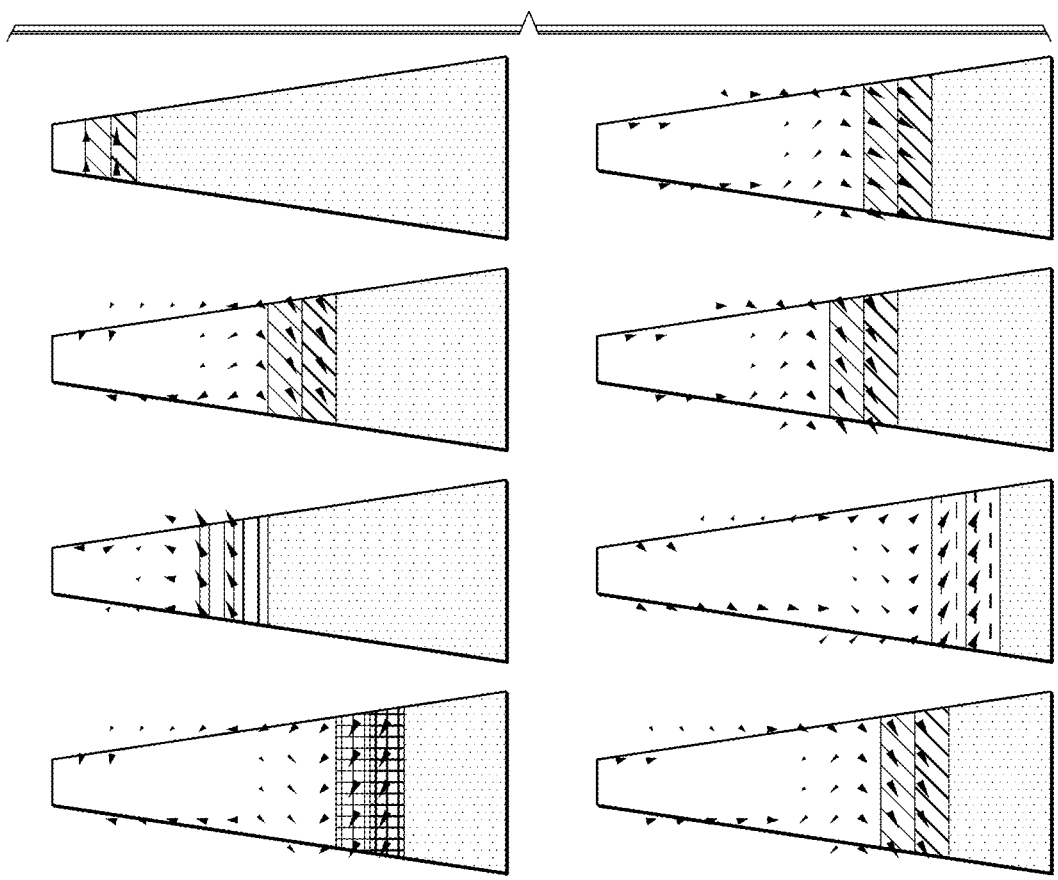
FIG. 15B illustrates snapshots of combined integration and leaking behavior of the trapezoidal neuron in accordance with an illustrative embodiment.

FIG. 15 illustrates combined integration and leaking behavior of the trapezoidal neuron in accordance with an illustrative embodiment. FIG. 15A shows applied current and DW position as a function of time, demonstrating the leaking and integrating functionalities of the neuron. A 2 ns period of integration with a 50 µA current is followed by a 30 ns period of leaking during which no current flows through the ferromagnetic track. This pattern repeats twice for a total runtime of 96 ns. As can be seen in the simulation results, the DW position increases rapidly when current is applied during the integration periods, and precesses while decreasing gradually when leaking in the absence of any external stimuli. FIG. 15B shows micromagnetic simulation snapshots for: (b) t=0, (c) t=2 ns, (d) t=17 ns, (e) t=32 ns, (f) t=34 ns, (g) t=64 ns, (h) t=66 ns, and (i) t=96 ns.

In an LIF neuron, the firing commences when enough energy has been stored in the neuron. In the case of the proposed 3T-MTJ neuron, firing occurs when the DW has passed underneath the tunnel barrier and fixed ferromagnet, switching the MTJ from its high-resistance state to its low-resistance state. This state change can provide a voltage pulse that can be used as an output spike that provides a current pulse to downstream synapses and neurons.

Figure 16:
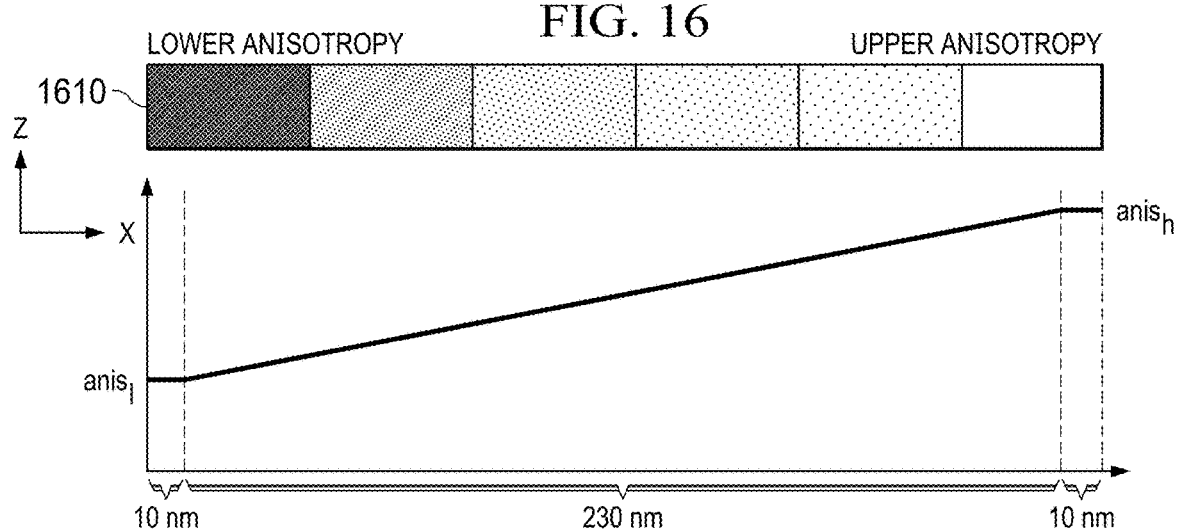
FIG. 16 illustrates a 3T-MTJ device with a graded-anisotropy ferromagnetic track in conjunction with an illustrative embodiment.

FIG. 16 illustrates a three-terminal, magnetic tunnel junction (3T-MTJ) device with a graded-anisotropy ferromagnetic track in conjunction with another illustrative embodiment. The 3T-MTJ device 1600 is similar in cross-section structure to devices 500 and 1200 shown in FIGS. 5A and 12A. However, in this embodiment instead of having a single uniaxial anisotropy value, the ferromagnetic track 1610 has a linearly graded uniaxial anisotropy value as shown in FIG. 16, wherein the anisotropy is oriented along the z-axis. Such a device can be implemented by irradiating the track 1610 with Ga+ ions or using a TaOx wedge placed on top of the track.

Micromagnetic simulations were performed using MuMax. The length L of the device is 250 nm, the width w of the device is 32 nm, and the thickness t of the device is 1.5 nm. The magnetic cells are 1×1×1.5 nm$^3$. The regions of frozen spin on either end of the DW track are 10 nm each, allowing for a 230 nm range of motion for the DW. The exchange stiffness $A_{ex}$ is $1.3 \times 10^{-11}$ J/m, the Landau-Lifshitz-Gilbert damping constant $\alpha$ is 0.02, the non-adiabaticity factor $\xi$ is 0.2, and the magnetic saturation $M_{sat}$ is 800*103 A/m. Since no external excitation is applied to the device, the external magnetic field $B_{ext}$ is 0 T. The DW itself is a Neel type domain wall.

The difference in anisotropy values creates a gradient of DW energies along the nanowire track, as regions of higher anisotropy correspond to a higher-energy state of the DW than regions of lower anisotropy. Therefore, with no external excitation applied to the device, the energy difference between regions of different anisotropies causes the DW to shift from the region of higher anisotropy to the region of lower anisotropy. It should be noted that a DW energy gradient along the nanowire track can be created by means other than anisotropy. Any type of nonuniform material property within the ferromagnetic DW track can be used to create the energy gradient.

Figure 17A:
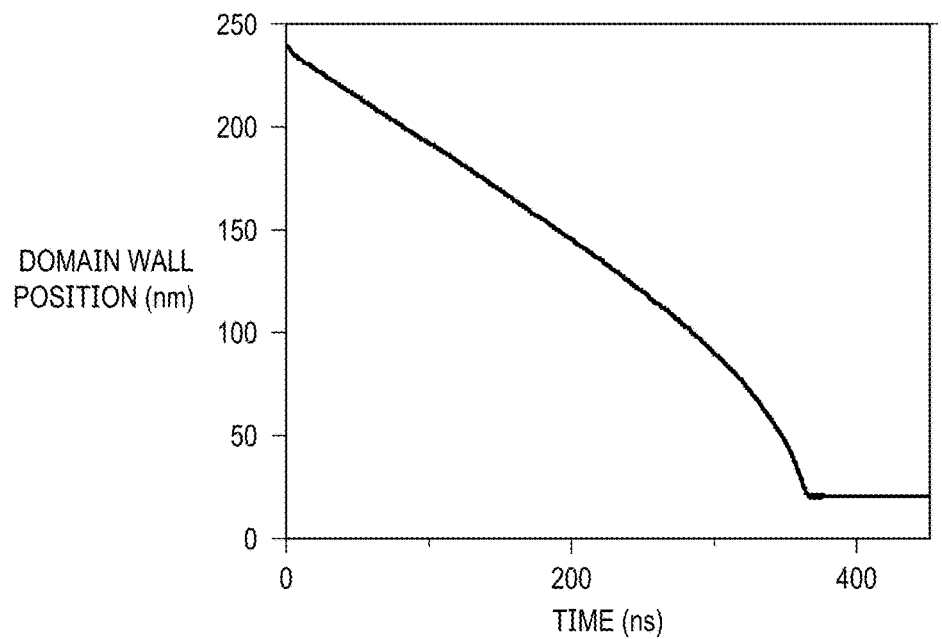
FIG. 17A illustrates a graph of DW position as a function of time in the absence of external stimuli in accordance with an illustrative embodiment.
Figure 17B:
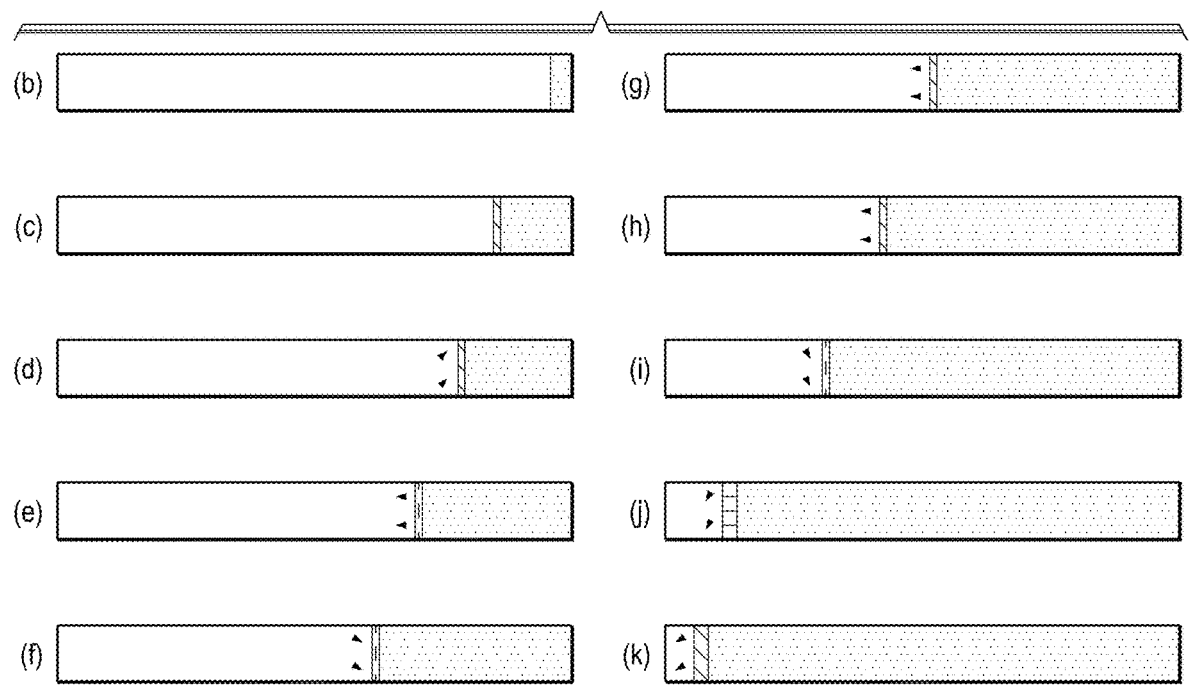
FIG. 17B illustrates snapshots of DW position as a function of time in the absence of external stimuli in accordance with an illustrative embodiment.

FIG. 17 illustrates leaking domain wall motion in the absence of external stimuli in accordance with an illustrative embodiment. FIG. 17A shows DW position as a function of time. After using a current to initialize the DW ~240 nm from the left end of the device (~10 nm from the right end of the device), the DW is allowed to gradually shift to the left end of the device. The DW reaches a steady state ~20 nm from the left end of the track. For this simulation, the lower anisotropy value is $0.5*10^6$ J/m$^3$ and the upper (larger) anisotropy value is $5*10^6$ J/m$^3$. In comparison, Co has an anisotropy of $-0.4*10^6$ J/m$^3$. FIG. 17B show snapshots from the micromagnetic simulation for: (b) t=0, (c) t=45 ns, (d) t=90 ns, (e) t=135 ns, (f) t=180 ns, (g) t=225 ns, (h) t=270 ns, (i) t=315 ns, (j)=360 ns, and (k) t=405 ns.

Figure 18A:
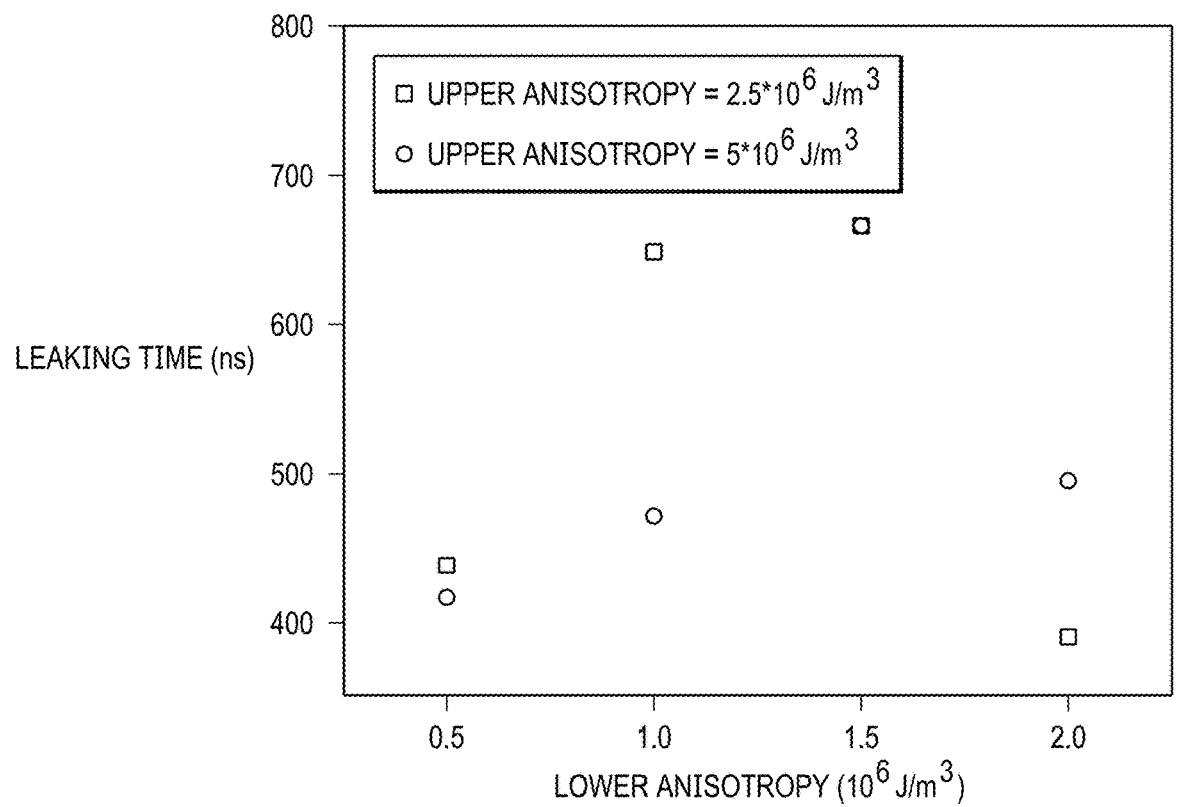
FIG. 18A illustrates a graph depicting leaking time induced by graded anisotropy dependent on lower and upper anisotropy values in accordance with an illustrative embodiment.
Figure 18B:
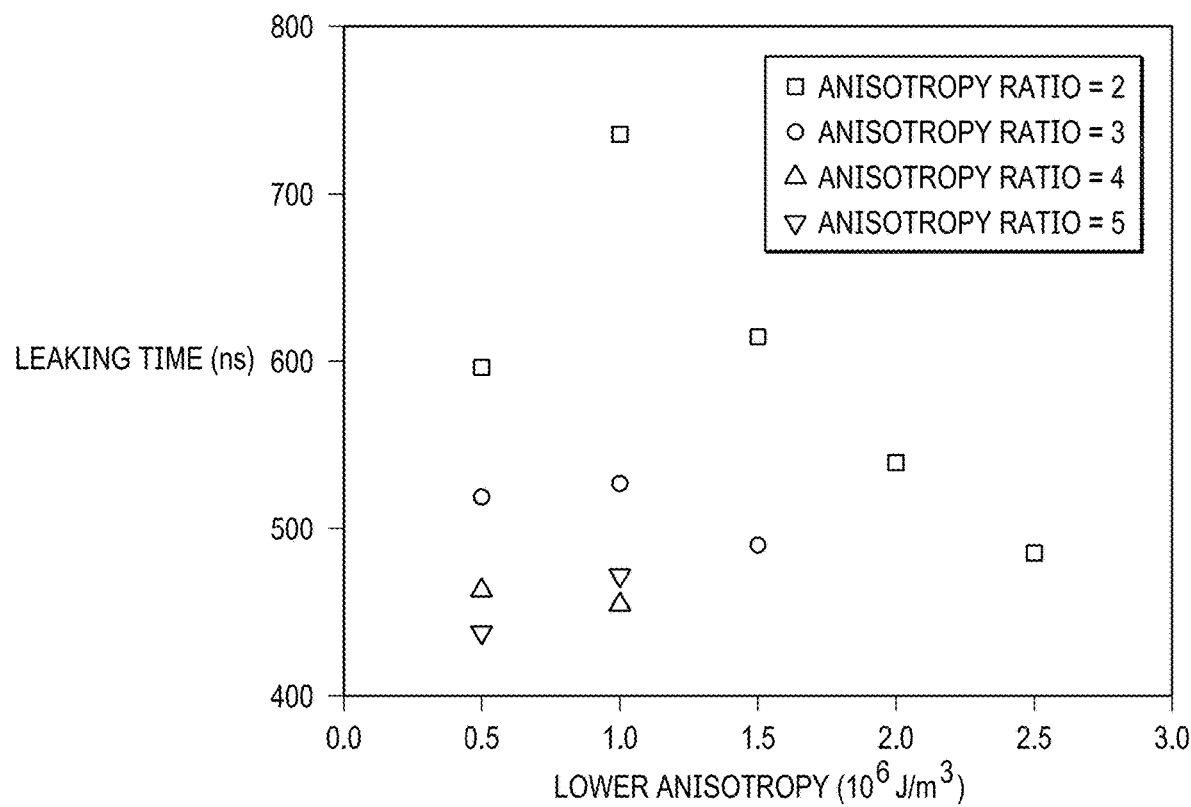
FIG. 18B illustrates a graph depicting leaking time induced by graded anisotropy dependent on the ratio between the lower and upper anisotropy values in accordance with an illustrative embodiment.

FIG. 18 illustrates motion induces by graded anisotropy for a wide variety of values and ratios in accordance with an illustrative embodiment. FIG. 18A shows the leaking time (the time taken for the DW to leak from one end of the track to the other) dependent on both the lower and upper anisotropy values. In general, as the ratio between the lower and upper anisotropy values increases the leaking time decreases, as shown in FIG. 18B.

The leaking time, however, is not solely dependent on the ratio of the upper to lower anisotropy values, but also on the anisotropy values themselves. While holding the anisotropy ratio at 2, increasing the lower anisotropy from $0.5*10^6$ J/m$^3$ to $1*10^6$ J/m$^3$ will cause the leaking time to increase, since the DW motion is hindered by the larger anisotropy. However, when increasing the lower anisotropy even further, the energy difference between regions with higher anisotropy and regions with lower anisotropy is large enough to counteract this effect. Additionally, within a certain range of anisotropy values, a precessional phenomenon similar to Walker breakdown occurs. If an extreme excitation—whether it is a current or an anisotropy gradient—within the appropriate range is applied to the device, an increase in the excitation will actually decrease the average velocity of the domain wall.

Since previous spintronic neurons used external currents, external magnetic fields, and even extra device layers, a 3T-MTJ device with graded anisotropy can be used to implement an LIF neuron with simpler hardware and fabrication requirements than previous LIF neurons. The integration and firing mechanisms remain the same as previous work.

A current passed through the DW track is integrated via the motion of the DW. As the DW shifts from regions of lower anisotropy to regions of higher anisotropy, the energy of the DW increases, causing the state of the neuron to change as well.

Figure 19A:
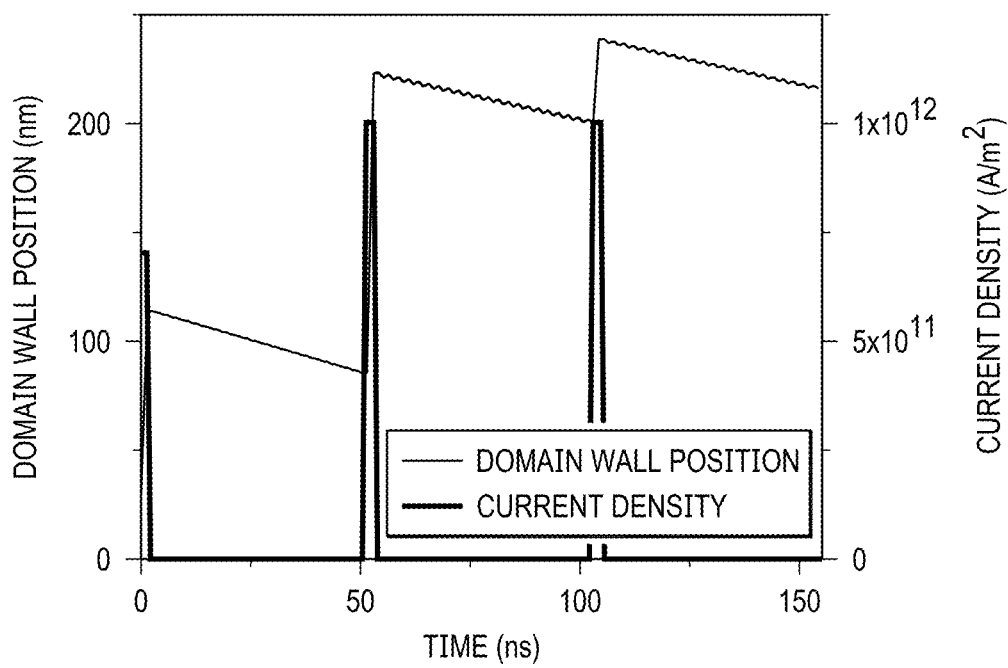
FIG. 19A illustrates a graph depicting the combined integrating and leaking functionalities of a graded-anisotropy device in accordance with an illustrative embodiment.
Figure 19B:
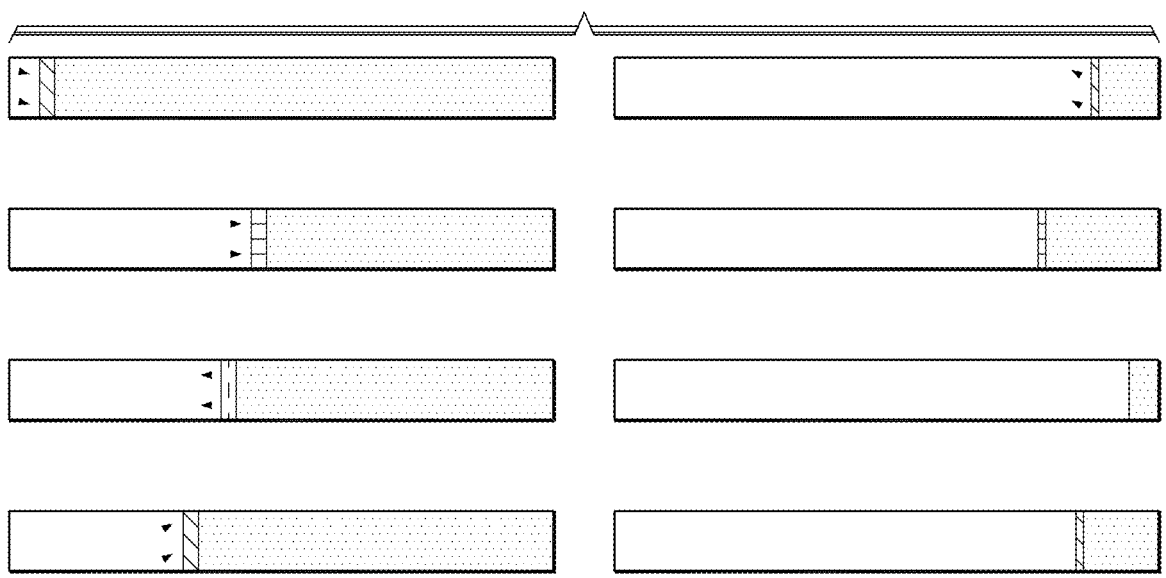
FIG. 19B illustrates snapshots depicting the combined integrating and leaking functionalities of a graded-anisotropy device in accordance with an illustrative embodiment.

FIG. 19 illustrates the combined integrating and leaking functionalities of the graded-anisotropy device in accordance with an illustrative embodiment. FIG. 19A shows DW position and current vs time graph demonstrating the leaking and integrating functionalities of the neuron. The lower anisotropy value is $5 \times 10^5$ J/m$^3$ and the upper anisotropy value is $50 \times 10^5$ J/m$^3$. A 2 ns pulse of $10^{12}$ A/m$^2$ is applied to the device, followed by a 50 ns leaking period. This process repeats twice, resulting in a total run time of 156 ns. During integration, the DW position shifts rapidly, and during leaking with no external stimuli, the DW precesses, as can be seen by the ripple in the DW position. FIG. 19B show snapshots from micromagnetic simulation for: (b) t=0, (c) t=2 ns, (d) t=27 ns, (e) t=52 ns, (f) t=54 ns, (g) t=104 ns, (h) t=106 ns, (i) t=156 ns.

In a standard LIF neuron, the neuron will produce an output spike once enough energy is stored. For the 3T-MTJ neuron, the output spike will be produced when the DW passes underneath the MTJ, switching the resistance state of the device from HRS to LRS. This will allow the use of a voltage pulse to reset the device and produce an output spike.

Figure 20:
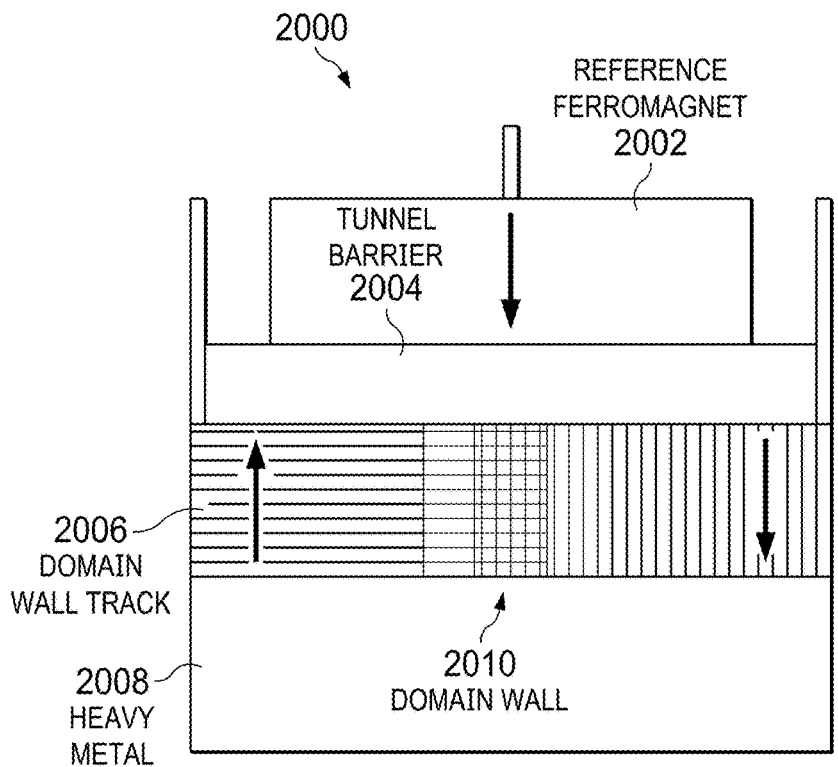
FIG. 20 illustrates a three-terminal DW-MTJ synapse with which illustrative embodiments can be implemented.

FIG. 20 illustrates a three-terminal DW-MTJ synapse with which illustrative embodiments can be implemented. Synapse 2000 might be an example of synapses 410 shown in FIG. 4.

The DW-MTJ based synapse 2000 comprises a single 3T-MTJ device that operates under similar principles as DW-MTJ neurons explained above. However, in contrast to DW-MTJ neurons, the synapse 2000 comprises a longer tunnel barrier 2004 that covers a larger portion of the DW track 2006, allowing the synapse 2000 to exhibit analog resistance states.

A DW track 2006 is placed over a heavy metal layer 2008. A fixed reference ferromagnetic layer 2002 of the synapse device 2000 is extended over the domain wall track 2006 to allow for a continuum of resistance states, wherein the resistance of the device is determined by the position of the DW 2010. The device might be located at the intersection of a word line and a bit line. The position of the DW 2010 is set via a large current applied during training to program the resistance state of the synapse 2000. In the example shown in FIG. 20, if the DW 2010 is on left side of the DW track 2006, the MTJ resistance is low. If the DW 2010 is on the right side of the track, the MTJ resistance is high.

During operation, low voltages from the corresponding input neuron read the resistance state of the device. When the resistance is low, the connectivity between the synapse and the corresponding output neuron is high, and the output current from the synapse is high. Conversely, when the resistance is high, the connectivity between the synapse and the corresponding output neuron is low, and the output current from the synapse is low.

Figure 21:
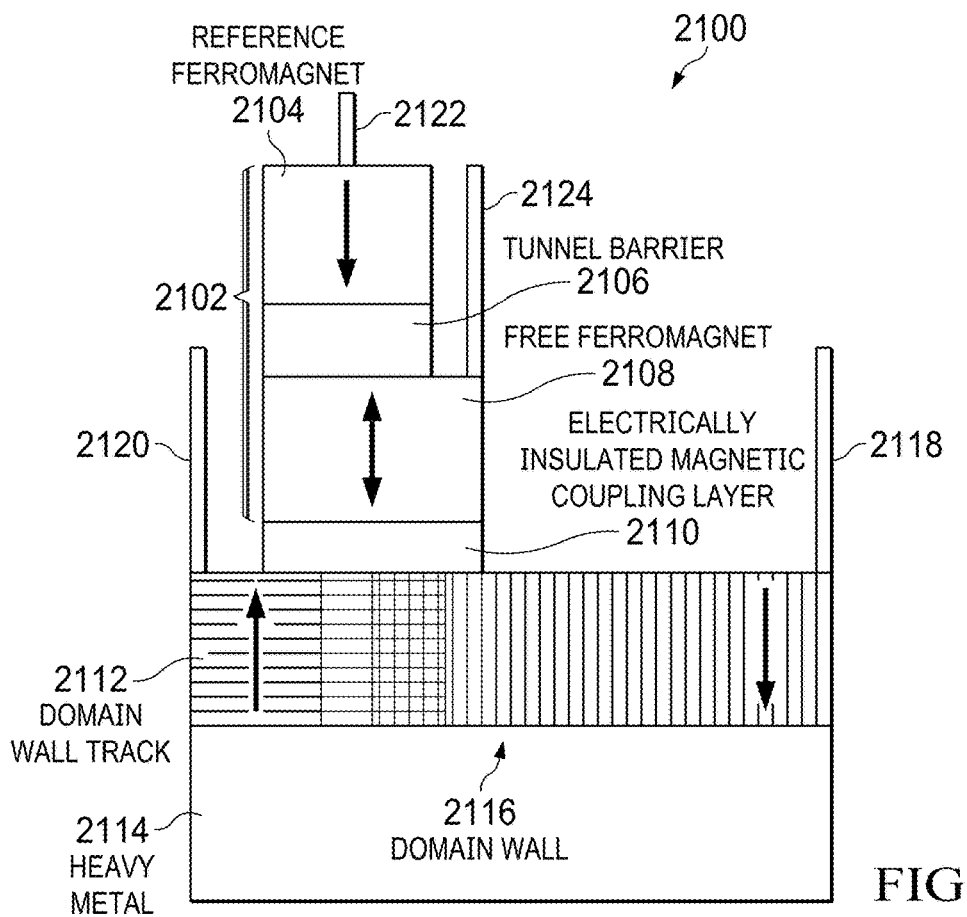
FIG. 21 illustrates a four-terminal DW-MTJ neuron in accordance with an illustrative embodiment.

FIG. 21 illustrates a four-terminal DW-MTJ neuron in accordance with an illustrative embodiment. Four-terminal LIF neuron 2100 operates in principle similarly to three-terminal neuron 500 in FIG. 5A. However, in order to avoid electrical connectivity between the input and output ports of the neuron, an additional free ferromagnet layer 2108 and magnetic couple layer 2110 is placed between the tunnel barrier 2106 and DW track 2112.

The four-terminal DW-MTJ device 2100 comprises a soft ferromagnetic track 2112, within which a DW 2116 moves, positioned over a heavy metal layer 2114. Terminals 2118, 2120 at both ends contain the DW 2116 within the track 2112.

An MTJ 2102 is positioned over the DW track 2112, between terminals 2118, 2120. MTJ 2102 comprises fixed reference ferromagnet 2104, tunnel barrier 2106 beneath the fixed ferromagnet 2104, and free ferromagnet 2108 beneath tunnel barrier 2106. Electrically insulated, magnetic coupling layer 2110 between free ferromagnet 2108 and DW track 2112 electrically isolates MTJ 2102 from DW track 2112.

When sufficient current flows through DW track 2112 between terminal 2118 and terminal 2120, DW wall 2116 shifts leftward (in this view) toward terminal 2120. As with the other embodiments, in the absence of sufficient signal integration, DW 2116 will drift rightward back toward terminal 2118 due to an energy gradient (created by any of the methods described above).

When the DW 2116 passes underneath the electrically isolated MTJ 2102, the free ferromagnet layer 2108 of MTJ 2102 reorients its magnetization due to dipole coupling, thereby changing the resistance state of MTJ 2102. This magnetization switch in free ferromagnet 2108, in combination with a voltage applied to third terminal 2122, results in current output through fourth terminal 2124 (i.e. spike). Therefore, four-terminal DW-MTJ neuron 2100 provides firing functionality without any electrical connectivity between MTJ 2102 and DW track 2112.

Figure 22:
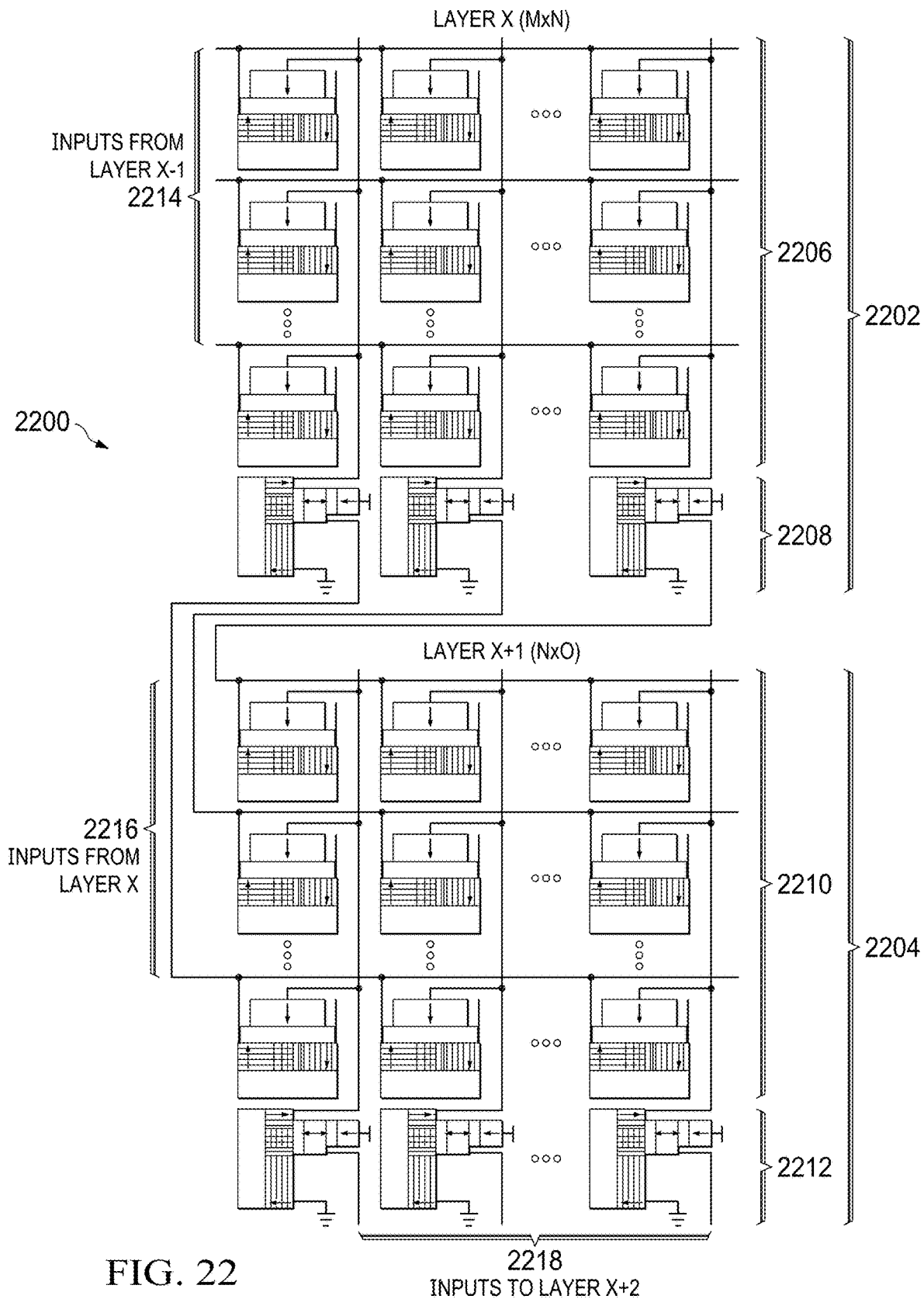
FIG. 22 illustrates a CMOS-free, multi-layer spintronic neural network in accordance with an illustrative embodiment.

FIG. 22 illustrates a CMOS-free, multi-layer spintronic neural network in accordance with an illustrative embodiment. Neural network 2200 comprises multiple layers of synapses and neurons. In the example shown, only two layers 2202, 2204 are illustrated, but it should be understood that network 2200 might comprise more than two layers.

In the example in FIG. 22, layer X 2202 comprise an M×N crossbar of synapses 2206 and four-terminal DW-MTJ neurons 2208. Similarly, the next layer X+1 2204 comprises an N×O crossbar of synapses 2210 and neurons 2212. Synapses 2206 and 2210 might comprise DW-MTJ synapses such as synapse 2000 shown in FIG. 20. Neurons 2208 and 2212 might comprise four-terminal DW-MTJ neurons such as neuron 2100 shown in FIG. 21.

Inputs 2214 into layer X 2202 might be outputs from a previous layer (X−1). Synapses 2206 might be programmed (trained) to provide respective weights to inputs 2214, which in turn affects how signals integrate in neurons 2208. In an embodiment, only one of neurons 2208 might fire due to lateral inhibition (explained above) in a winner-take-all manner in response to inputs 2214.

Outputs from layer X 2202 then serve as inputs 2216 into layer X+1 2204, which in turn might produce inputs 2218 to the next layer (X+2) in network 2200.

The electrical isolation provided by the electrically insulated, magnetic coupling layer 2110 in the four-terminal DW-MTJ neurons 2208, 2212 enables spintronic network 2200 to operate without complementary metal-oxide-semiconductors (CMOS), in contrast to other spintronic neural networks that require significant. CMOS circuitry in order to interconnect the layers, implement leaking, and provide lateral inhibition.

The electrical isolation of the four-terminal DW-MTJ neurons 2208, 2212 allows the M×N crossbar layer 2206 to be connected to an N×O crossbar layer 2210 while maintaining unidirectional signal flow due to the output signals coming from electrically isolated free ferromagnets (i.e. 2108). This CMOS-free spintronic architecture can be extended to deep neural networks with numerous layers with a more simplified fabrication in comparison to CMOS-dependent networks.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A domain wall magnetic tunnel junction device, comprising:
a number of ferromagnetic domain wall tracks within which are magnetic domain walls, wherein each domain wall track has a first fixed magnetization region at a first end and a second fixed magnetization region at a second end, and wherein the second fixed magnetization region has a magnetic direction opposite to the first fixed magnetization region;
a magnetic tunnel junction between the first and second ends of each domain wall track, wherein the magnetic tunnel junction comprises a tunnel barrier on the domain wall track and a fixed ferromagnet on top of the tunnel barrier; and
a magnetic field in communication with the domain wall tracks.

2. The device of claim 1, wherein the magnetic field is produced by a second fixed ferromagnet magnetically coupled to and electrically insulated from the domain wall tracks.

3. The device of claim 1, wherein the domain wall tracks are z-axis polarized, and wherein magnetization is in opposite directions on opposite sides of a domain wall.

4. The device of claim 1, further comprising multiple parallel domain wall tracks, wherein dipolar magnetic coupling from each domain wall track influences motion of domain walls in neighboring domain wall tracks.

5. The device of claim 4, wherein the dipolar magnetic coupling between neighboring domain wall tracks produces lateral inhibition.

6. A domain wall magnetic tunnel junction device, comprising:
a number of ferromagnetic domain wall tracks within which are magnetic domain walls, wherein each domain wall track has a first fixed magnetization region at a first end and a second fixed magnetization region at a second end, and wherein the second fixed magnetization region has a magnetic direction opposite to the first fixed magnetization region, and wherein each domain wall track is trapezoidal having a first width at the first end and a second width at the second opposite end, wherein the second width is greater than the first width; and
a magnetic tunnel junction between the first and second ends of each domain wall track, wherein the magnetic tunnel junction comprises a tunnel barrier on the domain wall track and a fixed ferromagnet on top of the tunnel barrier.

7. The device of claim 6, further comprising multiple parallel domain wall tracks, wherein dipolar magnetic coupling from each domain wall track influences motion of domain walls in neighboring domain wall tracks.

8. The device of claim 7, wherein the dipolar magnetic coupling between neighboring domain wall tracks produces lateral inhibition.

9. The device of claim 6, wherein the domain wall tracks are z-axis polarized, and wherein magnetization is in opposite directions on opposite sides of a domain wall.

10. A domain wall magnetic tunnel junction device, comprising:
a number of ferromagnetic domain wall tracks within which are magnetic domain walls, wherein each domain wall track has a first fixed magnetization region at a first end and a second fixed magnetization region at a second end, and wherein the second fixed magnetization region has a magnetic direction opposite to the first fixed magnetization region, and wherein each domain wall track has nonuniform material properties; and
a magnetic tunnel junction between the first and second ends of each domain wall track, wherein the magnetic tunnel junction comprises a tunnel barrier on the domain wall track and a fixed ferromagnet on top of the tunnel barrier.

11. The device of claim 10, wherein the nonuniform material property is magnetic anisotropy.

12. The device of claim 11, wherein the domain wall track has a graded magnetic anisotropy along its length wherein magnetic anisotropy is lower at the first end of the domain wall track and higher at the second opposite end of the domain wall track.

13. The device of claim 10, wherein the domain wall tracks are z-axis polarized, and wherein magnetization is in opposite directions on opposite sides of a domain wall.

14. The device of claim 10, further comprising multiple parallel domain wall tracks, wherein dipolar magnetic coupling from each domain wall track influences motion of domain walls in neighboring domain wall tracks.

15. The device of claim 14, wherein the dipolar magnetic coupling between neighboring domain wall tracks produces lateral inhibition.

16. A method of controlling domain wall motion in a domain wall magnetic tunnel junction device, the method comprising:
applying input current to the device, wherein the device comprises:
a ferromagnetic domain wall track within which is magnetic domain wall, wherein the domain wall track has a first fixed magnetization region at a first end and a second fixed magnetization region at a second end, and wherein the second fixed magnetization region has a magnetic direction opposite to the first fixed magnetization region;
a magnetic tunnel junction between the first and second ends of the domain wall track, wherein the magnetic tunnel junction comprises a tunnel barrier on the domain wall track and a fixed ferromagnet on top of the tunnel barrier;
integrating the input current, wherein the input current pushes the domain wall within the domain wall track toward the second end of the domain wall track, wherein magnetization within the domain wall track is in opposite directions on opposite sides of the domain wall;
exerting a constant opposing force that pushes the domain wall toward the first end of the domain wall track; and
wherein if integrating the input current exceeds the constant opposing force within a specified time period the domain wall reaches a threshold causing the magnetic tunnel junction to change from an anti-parallel state to a parallel state, producing an output firing spike from the device.

17. The method of claim 16, further comprising, after producing the output firing spike, resetting the device by pushing the domain wall back to the first fixed magnetization region.

18. The method of claim 16, wherein the constant opposing force is produced by an energy gradient within the domain wall track.

19. The method of claim 18, wherein the energy gradient is created by a magnetic field in communication with the domain wall track.

20. The method of claim 18, wherein the energy gradient is created by a non-rectangular shape of the domain wall track.

21. The method of claim 18, wherein the energy gradient is created by nonuniform material properties of the domain wall track.

22. The method of claim 16, wherein the device comprises multiple domain wall tracks, wherein dipolar magnetic coupling from each domain wall track influences motion of domain walls in neighboring domain wall tracks.

23. The method of claim 22, wherein the dipolar magnetic coupling between neighboring domain wall tracks produces lateral inhibition.

24. The method of claim 16, wherein the input current is in the form of input spikes.

25. The method of claim 16, wherein the device comprises an artificial leaky integrate-and-fire (LIF) neuron.

26. The method of claim 25, further comprising connecting the artificial LIF neuron through synapses to other LIF neurons in a neural network.

27. The method of claim 16, wherein the input current pushes the domain wall through spin-transfer torque.

28. The method of claim 16, wherein the input current flows through a heavy metal layer that pushes the domain wall through spin-orbit torque.

29. A domain wall magnetic tunnel junction device, comprising:
a ferromagnetic domain wall track within which is a magnetic domain wall, wherein the domain wall track has a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends;
a magnetic tunnel junction between the first and second ends of the domain wall track, wherein the magnetic tunnel junction comprises:
a fixed ferromagnet;
a tunnel barrier beneath the fixed ferromagnet;
a free ferromagnet beneath the tunnel barrier;
an electrically insulating, magnetic coupling layer between the free ferromagnet and the domain wall track, wherein the free ferromagnet is electrically isolated from, and magnetically coupled to, the domain wall track; and
a first electric terminal coupled to the first end of the domain wall track;
a second electric terminal coupled to the second end of the domain wall track;
a third electric terminal coupled to the fixed ferromagnet in the magnetic tunnel junction; and
a fourth electric terminal coupled to the free ferromagnet in the magnetic tunnel junction.

30. The device of claim 29, wherein the domain wall track is z-axis polarized, and wherein magnetization is in opposite directions on opposite sides of a domain wall.

31. The device of claim 29, further comprising multiple parallel domain wall tracks, wherein dipolar magnetic coupling from each domain wall track influences motion of domain walls in neighboring domain wall tracks.

32. The device of claim 31, wherein the dipolar magnetic coupling between neighboring domain wall tracks produces lateral inhibition.

33. A method of controlling domain wall motion in a domain wall magnetic tunnel junction device, the method comprising:
applying input current to the device, wherein the device comprises:
a ferromagnetic domain wall track within which is magnetic domain wall, wherein the domain wall track has a first fixed magnetization region at a first end and a second fixed magnetization region at a second end, and wherein the second fixed magnetization region has a magnetic direction opposite to the first fixed magnetization region;
a magnetic tunnel junction between the first and second ends of the domain wall track, wherein the magnetic tunnel junction comprises:
a fixed ferromagnet;
a tunnel barrier beneath the fixed ferromagnet; and
a free ferromagnet beneath the tunnel barrier;
an electrically insulating, magnetic coupling layer between the free ferromagnet and the domain wall track, wherein the free ferromagnet is electrically isolated from, and magnetically coupled to, the domain wall track;
integrating the input current, wherein the input current pushes the domain wall within the domain wall track toward the second end of the domain wall track, wherein magnetization within the domain wall track is in opposite directions on opposite sides of the domain wall;
exerting a constant opposing force that pushes the domain wall toward the first end of the domain wall track; and
wherein if integrating the input current exceeds the constant opposing force within a specified time period the domain wall reaches a threshold causing the magnetic tunnel junction to change from an anti-parallel state to a parallel state, producing an output firing spike from the device through a terminal coupled to the free ferromagnet.

34. A neural network, comprising:
a first crossbar array of synapses;
a first plurality of domain wall magnetic tunnel junction artificial neurons configured to receive first input signals from the first crossbar array of synapses;
a second crossbar array of synapses configured to receive second input signals from the first plurality of domain wall magnetic tunnel junction artificial neurons, wherein the second input signals comprise output signals from respective free ferromagnets in the first plurality of domain wall magnetic tunnel junction artificial neurons, wherein the free ferromagnets are electrically isolated from input terminals in the domain wall magnetic tunnel junction artificial neurons; and
a second plurality of domain wall magnetic tunnel junction artificial neurons configured to receive third input signals from the second crossbar array of synapses.

35. The neural network of claim 34, wherein the synapses in the first and second crossbar arrays comprise at least one of:
domain wall magnetic tunnel junction synapses;
non-volatile resistive switching devices; or
memristors.

36. The neural network of claim 34, wherein each domain wall magnetic tunnel junction artificial neuron comprises:
a ferromagnetic domain wall track within which is a magnetic domain wall, wherein the domain wall track has a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends;
a magnetic tunnel junction between the first and second ends of the domain wall track, wherein the magnetic tunnel junction comprises:
a fixed ferromagnet;
a tunnel barrier beneath the fixed ferromagnet;
a free ferromagnet beneath the tunnel barrier; and
an electrically insulating, magnetic coupling layer between the free ferromagnet and the domain wall track, wherein the free ferromagnet is electrically isolated from, and magnetically coupled to, the domain wall track.

37. The neural network of claim 36, wherein each domain wall magnetic tunnel junction artificial neuron further comprises:
a first electric terminal coupled to the first end of the domain wall track;
a second electric terminal coupled to the second end of the domain wall track;
a third electric terminal coupled to the fixed ferromagnet in the magnetic tunnel junction; and
a fourth electric terminal coupled to the free ferromagnet in the magnetic tunnel junction, wherein the fourth electric terminal is configured to provide an input signal to a synapse.

* * * * *